United States Patent
Maejima

(10) Patent No.: US 9,087,597 B2
(45) Date of Patent: Jul. 21, 2015

(54) SEMICONDUCTOR STORAGE

(71) Applicant: KABUSHIKI KAISHA TOSHIBA, Tokyo (JP)

(72) Inventor: Hiroshi Maejima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/014,252

(22) Filed: Aug. 29, 2013

(65) Prior Publication Data

US 2014/0269095 A1 Sep. 18, 2014

(30) Foreign Application Priority Data

Mar. 12, 2013 (JP) ................................. 2013-049184

(51) Int. Cl.
*G11C 16/26* (2006.01)
*G11C 16/28* (2006.01)
*G11C 7/06* (2006.01)
*G11C 16/24* (2006.01)
*G11C 16/04* (2006.01)

(52) U.S. Cl.
CPC *G11C 16/28* (2013.01); *G11C 7/06* (2013.01); *G11C 16/0483* (2013.01); *G11C 16/24* (2013.01); *G11C 16/26* (2013.01)

(58) Field of Classification Search
CPC ........ G11C 16/10; G11C 16/24; G11C 7/067; G11C 16/26; G11C 16/0483; G11C 7/06
USPC ........................................ 365/185.21, 185.25
See application file for complete search history.

(56) References Cited

U.S. PATENT DOCUMENTS

| 7,456,562 | B2 | 11/2008 | Yokoyama | |
|---|---|---|---|---|
| 8,203,888 | B2 | 6/2012 | Fukuda et al. | |
| 2007/0008779 | A1* | 1/2007 | Isobe | 365/185.18 |
| 2007/0255893 | A1* | 11/2007 | Takeuchi | 711/103 |
| 2009/0080265 | A1* | 3/2009 | Mokhlesi et al. | 365/185.23 |
| 2010/0214837 | A1* | 8/2010 | Sako et al. | 365/185.03 |
| 2011/0075485 | A1* | 3/2011 | Fukuda et al. | 365/185.17 |
| 2011/0090736 | A1* | 4/2011 | Tanaka et al. | 365/185.03 |
| 2011/0103152 | A1* | 5/2011 | Yoshihara et al. | 365/185.21 |
| 2011/0286268 | A1* | 11/2011 | Iwai et al. | 365/185.03 |
| 2011/0305089 | A1* | 12/2011 | Abe et al. | 365/185.17 |
| 2012/0075929 | A1* | 3/2012 | Roohparvar et al. | 365/185.2 |
| 2013/0003454 | A1* | 1/2013 | Edahiro et al. | 365/185.02 |
| 2013/0083607 | A1* | 4/2013 | Joo et al. | 365/185.21 |
| 2013/0250698 | A1* | 9/2013 | Kim | 365/185.25 |

FOREIGN PATENT DOCUMENTS

JP 2011-258289 A 12/2011
JP 2012-144628 A 8/2012

* cited by examiner

*Primary Examiner* — Huan Hoang
*Assistant Examiner* — Jay Radke
(74) *Attorney, Agent, or Firm* — Patterson & Sheridan, LLP

(57) ABSTRACT

A semiconductor storage includes memory cells, a bit line, and a sense amplifier having a first transistor that controls precharging of the bit line, a second transistor that controls charging of a first node, a third transistor that controls connection of the bit line to the first node, a fourth transistor that controls connection of the first node to a second node, a fifth transistor that controls connection of the first node to a third node, and a sixth transistor that is controlled to sense a potential of the third node. The controller controls the first through sixth transistors of data to perform a read operation based on the potential of the third node.

19 Claims, 17 Drawing Sheets

Off-worst pattern

On-worst pattern

SEMICONDUCTOR STORAGE

CROSS-REFERENCE TO RELATED APPLICATION

This application is based upon and claims the benefit of priority from Japanese Patent Application No. 2013-049184, filed Mar. 12, 2013, the entire contents of which are incorporated herein by reference.

FIELD

Embodiments described herein relate generally to semiconductor storage devices.

BACKGROUND

A NAND flash memory in which memory cells are three-dimensionally arranged is known in the art.

DETAILED DESCRIPTION

Figure 1:
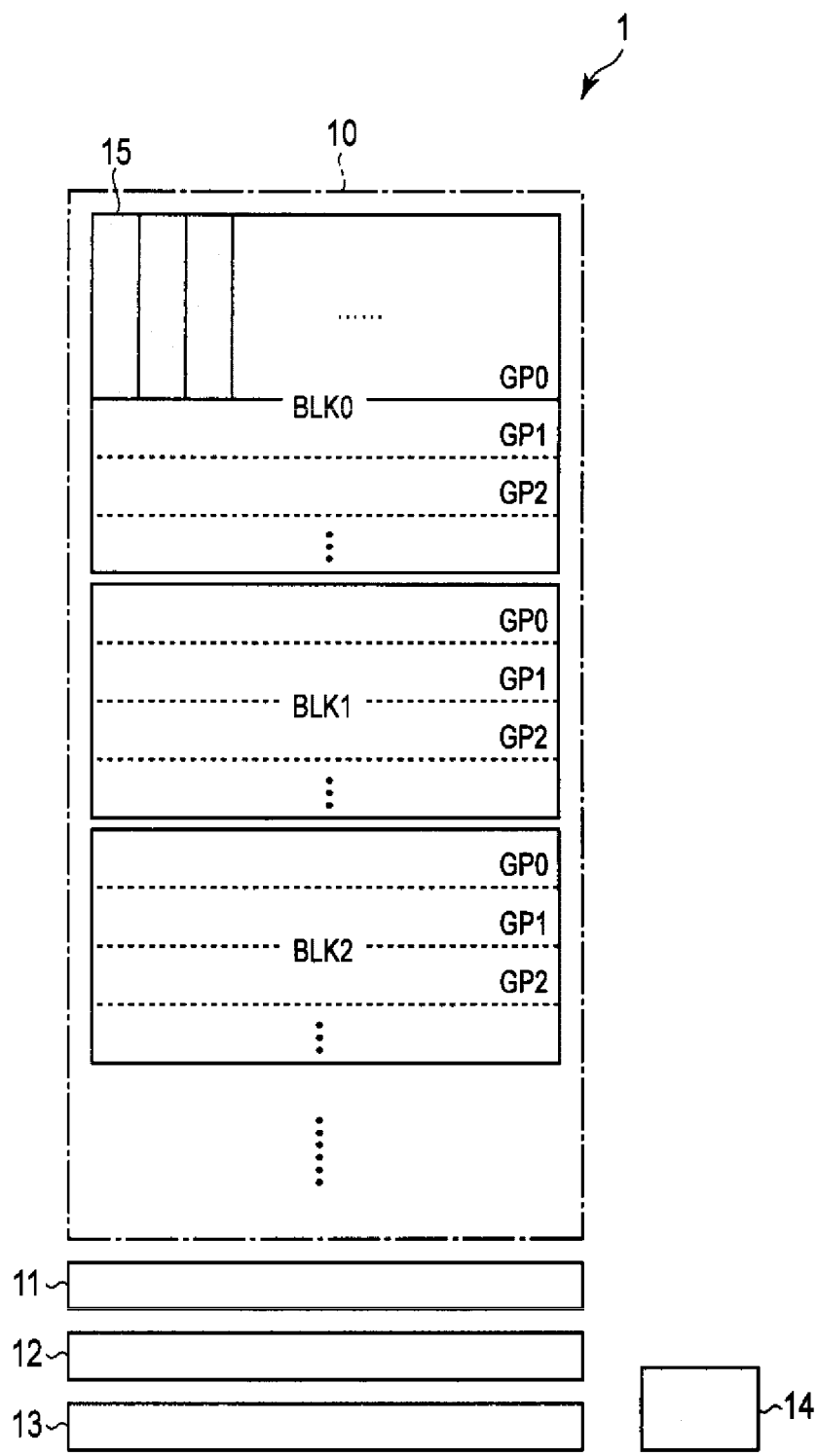
FIG. 1 is a block diagram of a semiconductor storage according to an embodiment.

A semiconductor storage that can improve the speed at which a read operation is carried out is provided.

In general, according to one embodiment, a semiconductor storage of an embodiment includes memory cells, a bit line, and a sense amplifier. The memory cells are formed on a semiconductor substrate. The bit line is electrically connected to the memory cells and the sense amplifier. The sense amplifier includes first to sixth transistors. The first transistor is controlled to precharge the bit line. The second transistor is controlled to charge a first node. The third transistor is controlled to connect the bit line to the first node. The fourth transistor is controlled to connect the first node to a second node. The fifth transistor is controlled to connect the first node to a third node. The sixth transistor is controlled to sense the potential of the third node. Then, during the read operation: (1) the first through fourth transistors are turned on while the fifth through sixth transistors are turned off; (2) the second transistor is then turned off in a second time period after the first time period; (3) the second transistor is turned on and the fourth transistor is turned off in a third time period after the second time period; (4) the second transistor is turned off in a fourth time period after the third time period; (5) the fifth transistor is turned on and the third transistor is turned off in a fifth time period after the fourth time period; and (6) the fourth transistor is turned on and the fifth transistor is turned off in a sixth time period after the fifth time period.

Hereinafter, the embodiment will be described with reference to the drawings. In this description, common portions are identified with common reference characters in all the drawings.

A semiconductor storage according to the embodiment will be described. In the following description, the semiconductor storage will be described, taking up as an example a three-dimensional stacked NAND flash memory in which memory cells are stacked on a semiconductor substrate.

1. Regarding the Configuration of the Semiconductor Storage

First, the configuration of the semiconductor storage according to the embodiment will be described.

1.1 Regarding the Overall Configuration of the Semiconductor storage

FIG. 1 is a block diagram of the semiconductor storage according to the embodiment. As shown in the drawing, a NAND flash memory 1 includes a memory cell array 10, a sense amplifier module 11, a column selector 12, an input and output circuit 13, and a control circuit 14.

The memory cell array 10 includes a plurality of (for example, N) blocks BLK (BLK0, BLK1, BLK2, . . . ), each being a group of nonvolatile memory cells. Data in one block BLK is collectively erased. Each block BLK includes a plurality of (for example, M) memory groups GP (GP0, GP1, GP2, . . . ), each being a group of NAND strings 15, each NAND string 15 being formed of memory cells connected in series. There may be an arbitrary number of blocks in the memory cell array 10 and an arbitrary number of memory groups in the block.

At the time of reading of data, the sense amplifier module 11 senses and amplifies data read from the memory cells. Moreover, at the time of writing of data, the sense amplifier module 11 transfers write data to the memory cells. The sense amplifier module 11 has a plurality of sets of a sense amplifier unit, a latch circuit, a bus, and so forth. The details thereof will be described later.

The column selector 12 selects a column direction (a bit line which will be described later) of the memory cell array 10.

The input and output circuit 13 controls sending and receiving of data between the NAND flash memory 1 and a controller or a host device outside the NAND flash memory 1. In addition, at the time of reading of data, the input and output circuit 13 outputs the data sensed and amplified by the sense amplifier module 11 to the outside. Moreover, at the time of writing of data, the input and output circuit 13 receives write data from the outside and transfers the write data to the sense amplifier module 11.

The control circuit 14 controls the entire operation of the NAND flash memory 1.

1.2 Regarding the Memory Cell Array 10

Figure 2:
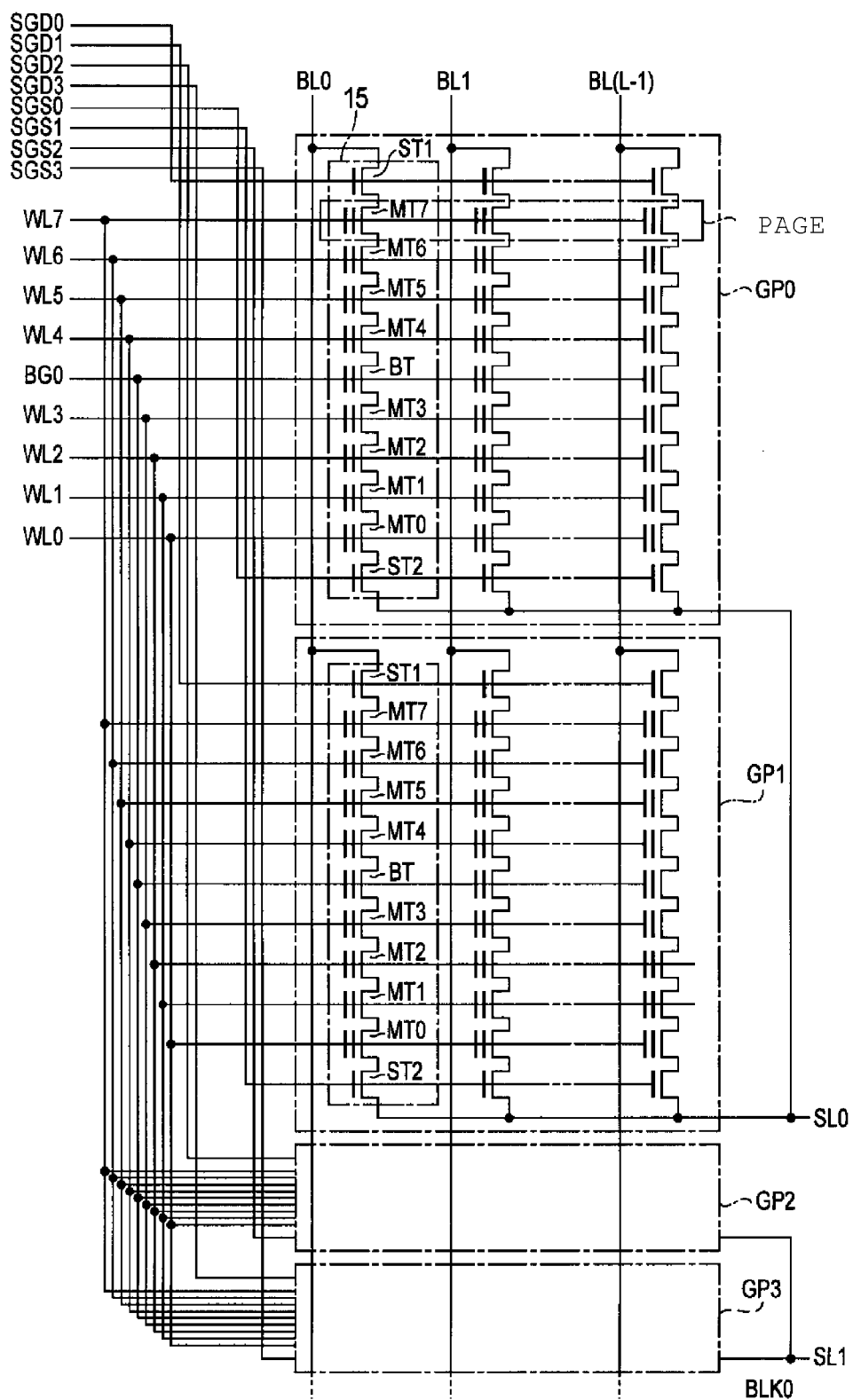
FIG. 2 is a circuit diagram of a memory cell array according to the embodiment.

Next, the details of the configuration of the memory cell array 10 described above will be described. FIG. 2 is a circuit diagram of the block BLK0. The other blocks BLK also have the same configuration.

As shown in the drawing, the block BLK0 includes the plurality of memory groups GP. Moreover, each memory group GP includes the plurality of (in this embodiment, L) NAND strings 15.

Each of the NAND strings 15 includes, for example, 8 memory cell transistors MT (MT0 to MT7), selection transistors ST1 and ST2, and a back-gate transistor BT. Each memory cell transistor MT is provided with a stacked gate including a control gate and a charge storage layer and holds data in a nonvolatile manner. Incidentally, the number of memory cell transistors MT is not limited to 8, there may be, for example, 16, 32, 64, or 128 memory cell transistors MT, and the number of memory cell transistors MT is not limited to a particular number. As is the case with the memory cell transistors MT, the back-gate transistor BT is also provided with a stacked gate including a control gate and a charge storage layer. However, the back-gate transistor BT is not provided to hold data, and functions as a current path at the time of writing and erasing of data. The memory cell transistors MT and the back-gate transistor BT are disposed in such a way that the current paths thereof are connected in series between the selection transistors ST1 and ST2. Incidentally, the back-gate transistor BT is provided between the memory cell transistors MT3 and MT4. The current path of the memory cell transistor MT7 at one end of this serial connection is connected to one end of the current path of the selection transistor ST1, and the current path of the memory cell transistor MT0 at the other end is connected to one end of the current path of the selection transistor ST2.

The gates of the selection transistors ST1 of the memory groups GP0 to GP(M-1) are connected to select gate lines SGD0 to SGD (M-1) by common connection, and the gates of the selection transistors ST2 are connected to select gate lines SGS0 to SGS (M-1) by common connection. On the other hand, the control gates of the memory cell transistors MT0 to MT7 in the block BLK0 are connected to word lines WL0 to WL7 by common connection, and the control gate of the back-gate transistor BT is connected to a back-gate line BG (BG0 to BG(N-1) in the blocks BLK0 to BLK(N-1)) by common connection.

That is, while connection with the word lines WL0 to WL7 and the back-gate line BG is common among the plurality of memory groups GP in the block BLK0, independent select gate lines SGD and SGS are provided for each memory group GP even in the block BLK0.

Moreover, of the NAND strings 15 arranged in a matrix in the memory cell array 10, the other ends of the current paths of the selection transistors ST1 of the NAND strings 15 in the same column are connected to any bit line BL by common connection. That is, the bit line BL connects the NAND strings 15 by common connection among the plurality of blocks BLK. Furthermore, the other ends of the current paths of the selection transistors ST2 are connected to any source line SL. The source line SL connects the NAND strings 15 by common connection among the plurality of memory groups GP, for example.

As described earlier, the data of the memory cell transistors MT in one block BLK is collectively erased. On the other hand, reading and writing of data is collectively performed on a plurality of memory cell transistors MT in any memory groups GP of any block BLK that are connected to any word line WL by common connection. The plurality of memory cell transistors MT that are read or written to as a unit is called a "page".

In the memory cell array 10 with the above-described configuration, the memory cell transistors MT, the selection transistors ST1 and ST2, and the back-gate transistor BT are three-dimensionally stacked above the semiconductor substrate. As an example, part of a peripheral circuit such as the sense amplifier module 11 is formed on the semiconductor substrate, and the memory cell array 10 is formed above the peripheral circuit.

The configuration of the memory cell array 10 is described in, for example, U.S. patent application Ser. No. 12/407,403, entitled "Three dimensional stacked nonvolatile semiconductor memory", filed on Mar. 19, 2009. Moreover, the configuration of the memory cell array 10 is described in U.S. patent application Ser. No. 12/406,524, entitled "Three dimensional stacked nonvolatile semiconductor memory", filed on Mar. 18, 2009, in U.S. patent application Ser. No. 12/679,991, entitled "Non-volatile semiconductor storage device and method of manufacturing the same", filed on Mar. 25, 2010, and in U.S. patent application Ser. No. 12/532,030, entitled "Semiconductor memory and method for manufacturing the same", filed on Mar. 23, 2009. The entire contents of these patent applications are incorporated herein by reference.

1.3 Regarding the Sense Amplifier Module 11

Figure 3:
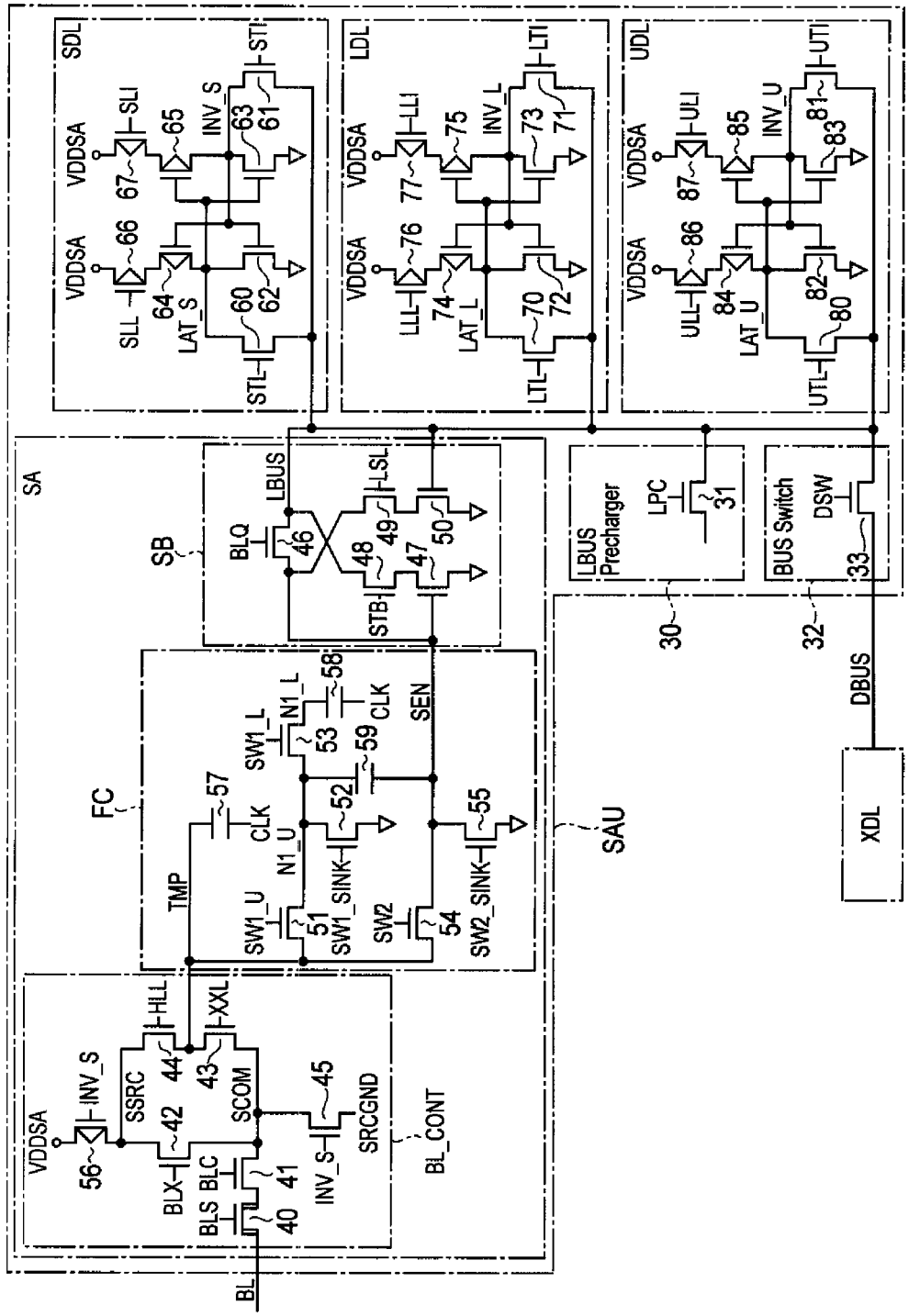
FIG. 3 is a circuit diagram of a sense amplifier unit according to the embodiment.

Next, the configuration of the sense amplifier module 11 will be described. FIG. 3 is a circuit diagram of the sense amplifier module 11 and illustrates, in particular, a configuration provided for one bit line BL.

As shown in the drawing, the sense amplifier module 11 includes a sense amplifier unit SAU and a latch circuit XDL for each bit line BL.

The sense amplifier unit SAU senses and amplifies the data read by a corresponding bit line BL and transfers the data written into the corresponding bit line BL. The latch circuit XDL is also provided for each bit line BL and temporarily holds data related to a corresponding bit line BL. Sending and receiving of data between the sense amplifier unit SAU and the input and output circuit 13 is performed via the latch circuit XDL. In addition, the latch circuit XDL is used for a cache operation of the NAND flash memory 1. That is, a plurality of latch circuits, which will be described later, are contained in the sense amplifier unit SAU, and, when these latch circuits are being used, even if the latch circuit XDL is not used, the NAND flash memory 1 can receive data from the outside.

The sense amplifier unit SAU and the latch circuit XDL are connected to each other by a bus DBUS in such a way that data can be transmitted to and received from each other. The bus DBUS is shared by a plurality of (for example, 16) sense amplifier units SAU.

Next, the details of the configuration of the sense amplifier unit SAU will be described with also reference to FIG. 3.

As shown in FIG. 3, the sense amplifier unit SAU includes a sense amplifier section SA, three latch circuits SDL, UDL, and LDL, a precharge circuit 30, and a bus switch 32.

The sense amplifier section SA senses and amplifies the data read by the bit line BL and applies a voltage to the bit line BL in accordance with the write data. That is, the sense amplifier section SA is a module that directly controls the bit line BL. The latch circuits SDL, UDL, and LDL temporarily hold data. At the time of writing of data, the sense amplifier section SA controls the potential of the bit line BL in accordance with the data held by the latch circuit SDL, for example, of the three latch circuits. Moreover, the data sensed and amplified by the sense amplifier section SA is first stored in the latch circuit SDL, for example. The other latch circuits UDL and LDL are used for a multi-level action in which the individual memory cell transistors hold 2 bits or more of data or for performing what is known as Quick Pass. In addition, in each sense amplifier unit SAU, the sense amplifier section SA and the three latch circuits SDL, UDL, and LDL are connected to one another by a bus LBUS in such a way that data can be transmitted to and received from one another.

As shown in FIG. 3, the sense amplifier section SA includes a high-voltage n-channel MOS transistor 40, low-voltage n-channel MOS transistors 41 to 55, a low-voltage p-channel MOS transistor 56, and capacitor elements 57 to 59.

In the transistor 40, a signal BLS is applied to the gate thereof, and one end of a current path thereof is connected to a corresponding bit line BL. In the transistor 41, one end of a current path thereof is connected to the other end of the current path of the transistor 40, a signal BLC is applied to the gate, and the other end of the current path of the transistor 41 is connected to a node SCOM. The transistor 41 is provided to clamp the corresponding bit line BL to a potential according to the signal BLC.

In the transistor 45, one end of a current path thereof is connected to the node SCOM, the other end of the current path of the transistor 45 is connected to a node SRCGND (for example, 0 V), and the gate is connected to a node INV_S. In the transistor 42, one end of a current path thereof is connected to the node SCOM, the other end of the current path of the transistor 42 is connected to a node SSRC, and a control signal BLX is input to the gate. In the transistor 56, one end of a current path thereof is connected to the node SSRC, a power supply voltage VDDSA is provided to the other end of the current path of the transistor 56, and the gate is connected to the node INV_S. In the transistor 43, one end of a current path thereof is connected to the node SCOM, the other end of the current path of the transistor 43 is connected to a node TMP, and a control signal XXL is input to the gate. In the transistor 44, one end of a current path thereof is connected to the node SSRC, the other end of the current path of the transistor 44 is connected to the node TMP, and a control signal HLL is input to the gate.

In the transistor 47, one end of a current path thereof is grounded and the gate is connected to a node SEN. In the transistor 48, one end of a current path thereof is connected to the other end of the current path of the transistor 47, the other end of the current path of the transistor 48 is connected to the bus LBUS, and a control signal STB is input to the gate.

In the transistor 46, one end of a current path thereof is connected to the node SEN, the other end of the current path of the transistor 46 is connected to the bus LBUS, and a control signal BLQ is input to the gate. In the transistor 50, one end of a current path thereof is grounded and the gate is connected to the bus LBUS. In the transistor 49, one end of a current path thereof is connected to the other end of the current path of the transistor 50, the other end of the current path of the transistor 49 is connected to the node SEN, and a control signal LSL is input to the gate.

The capacitor element 57 has one electrode connected to the node TMP and the other electrode to which a clock CLK is input.

In the transistor 51, one end of a current path thereof is connected to the node IMP, the other end of the current path of the transistor 51 is connected to a node N1_U, and a signal SW1_U is input to the gate. In the transistor 52, one end of a current path thereof is connected to the node N1_U, the other end of the current path of the transistor 52 is grounded, and a signal SW1_SINK is input to the gate. In the transistor 53, one end of a current path thereof is connected to the node N1_U, the other end of the current path of the transistor 53 is connected to a node N1_L, and a signal SW1_L is input to the gate. The capacitor element 58 has one electrode connected to the node N1_L and the other electrode to which the clock CLK is input.

In the transistor 54, one end of a current path thereof is connected to the node IMP, the other end of the current path of the transistor 54 is connected to the node SEN, and a signal SW2 is input to the gate. In the transistor 55, one end of a current path thereof is connected to the node SEN, the other end of the current path of the transistor 55 is grounded, and a signal SW2_SINK is input to the gate. The capacitor element 59 has one electrode connected to the node N1_U and the other electrode connected to the node SEN.

In the above configuration, the transistors 40 to 45 and 56 function as a bit line control section BL_CONT that controls the potential of the bit line BL and senses data. Moreover, the transistors 51 to 55 and the capacitor elements 57 to 59 function as a forecasting section FC that forecasts read data based on the sensed data in a manner as will be described later. Furthermore, the transistors 46 to 50 function as a strobe section SB that transfers the read data to the latch circuit SDL via the bus LBUS.

Next, the latch circuit SDL will be described with also reference to FIG. 3. As shown in the drawing, the latch circuit SDL includes low-voltage n-channel MOS transistors 60 to 63 and low-voltage p-channel MOS transistors 64 to 67.

In the transistor 60, one end of a current path thereof is connected to the bus LBUS, the other end of the current path of the transistor 60 is connected to anode LAT_S, and a control signal STL is input to the gate. In the transistor 61, one end of a current path thereof is connected to the bus LBUS, the other end of the current path of the transistor 61 is connected to the node INV_S, and a control signal STI is input to the gate. In the transistor 62, one end of a current path thereof is grounded, the other end of the current path of the transistor 62 is connected to the node LAT_S, and the gate is connected to the node INV_S. In the transistor 63, one end of a current path thereof is grounded, the other end of the current path of the transistor 63 is connected to the node INV_S, and the gate is connected to the node LAT_S. In the transistor 64, one end of a current path thereof is connected to the node LAT_S and the gate is connected to the node INV_S. In the transistor 65, one end of a current path thereof is connected to the node INV_S and the gate is connected to the node LAT_S. In the transistor 66, one end of a current path thereof is connected to the other end of the current path of the transistor 64, the power supply voltage VDDSA is applied to the other end of the current path of the transistor 66, and a control signal SLL is input to the gate. In the transistor 67, one end of a current path thereof is connected to the other end of the current path of the transistor 65, the power supply voltage VDDSA is applied to the other end of the current path of the transistor 67, and a control signal SLI is input to the gate.

In the latch circuit SDL, the transistors 62 and 64 form a first inverter and the transistors 63 and 65 form a second inverter. In addition, the output of the first inverter and the input (node LAT_S) of the second inverter are connected to the bus LBUS via the transistor 60 for data transfer, and the input of the first inverter and the output (node INV_S) of the second inverter are connected to the bus LBUS via the transistor 61 for data transfer. The latch circuit SDL holds data in the node LAT_S and holds data obtained by inversion of that data in the node INV_S.

Since the latch circuits LDL and UDL have the same configurations as the configuration of the latch circuit SDL, the descriptions thereof are omitted, but, as shown in FIG. 3, the transistors and the control signals of the latch circuits LDL and UDL are identified with reference characters and names that are different from the reference characters and names of the latch circuit SDL to distinguish the transistors and the control signals of the latch circuits LDL and UDL from the transistors and the control signals of the latch circuit SDL.

The precharge circuit 30 precharges the bus LBUS. The precharge circuit 30 includes, for example, a low-voltage n-channel MOS transistor 31, one end of a current path thereof is connected to the bus LBUS, and a control signal LPC is applied to the gate.

The bus switch 32 connects the sense amplifier unit SAU to the latch circuit XDL by connecting the bus DBUS and the bus LBUS. That is, the bus switch 32 includes, for example, a low-voltage n-channel MOS transistor 33, one end of a current path thereof is connected to the bus DBUS, the other end of the current path of the low-voltage n-channel MOS transistor 33 is connected to the bus LBUS, and a control signal DSW is applied to the gate.

2. Regarding a Data Read Operation

Next, a data read operation according to the embodiment will be described below, paying special attention to the operation of the sense amplifier unit SAU.

2.1 Regarding a General Flow of a Read Operation

Figure 4:
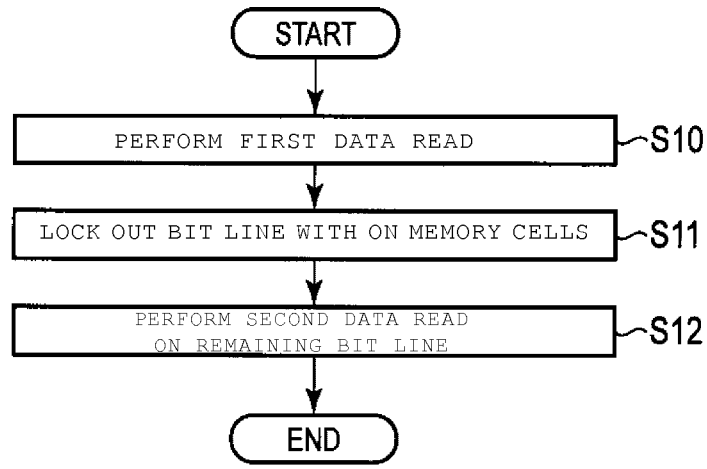
FIG. 4 is a flowchart of a data read method according to the embodiment.

First, a general flow of a read operation will be described by using FIG. 4. FIG. 4 is a flowchart of the read operation. The following operation is performed as a result of the control circuit 14 controlling the various control signals.

As shown in the drawing, data read is performed in two operations. That is, the control circuit 14 first performs first data read (Step S10). This read operation is collectively performed on all the bit lines BL. In a bit line BL in which the memory cell transistors are turned on, a cell current flows from the bit line BL to the source line SL. On the other hand, in a bit line BL in which the memory cell transistors are turned off, the cell current does not flow. As described above, data determination can be performed based on whether or not the current flows.

Next, the control circuit 14 locks out the bit lines BL (the bit lines through which the cell current flowed) in which the memory cell transistors were turned on during the first read (Step S11). That is, the control circuit 14 fixes the bit lines BL through which the cell current flowed to the same potential (for example, 0 V) as the potential of the source line SL.

Next, the control circuit 14 performs a second read operation on the remaining bit line BL, that is, the bit line BL that was not locked out in Step S11 (Step S12).

The reason why the read operation is performed in two operations is that the memory cell array, because of manufacturing variances and other factors, includes bit lines through which a current easily flows and bit lines through which a current does not flow easily. If a judgment on the read data is made based on only the first read, when a read is performed on a bit line through which a current does not flow easily, there is a possibility that the bit line may erroneously be determined to hold "0" data (a high threshold value) even when the memory cell transistors hold "1" data (a low threshold value). In this regard, by locking out the bit line that is judged to hold "1" data after the first read, the total sum of the total current in the memory cell arrays is reduced, whereby a rise of the source line can be suppressed. By performing the read again in this state, high-precision data read can be performed even on bit lines through which a current does not flow easily. In the following description, the above-described read method is referred to as a "double read method".

Figure 5:
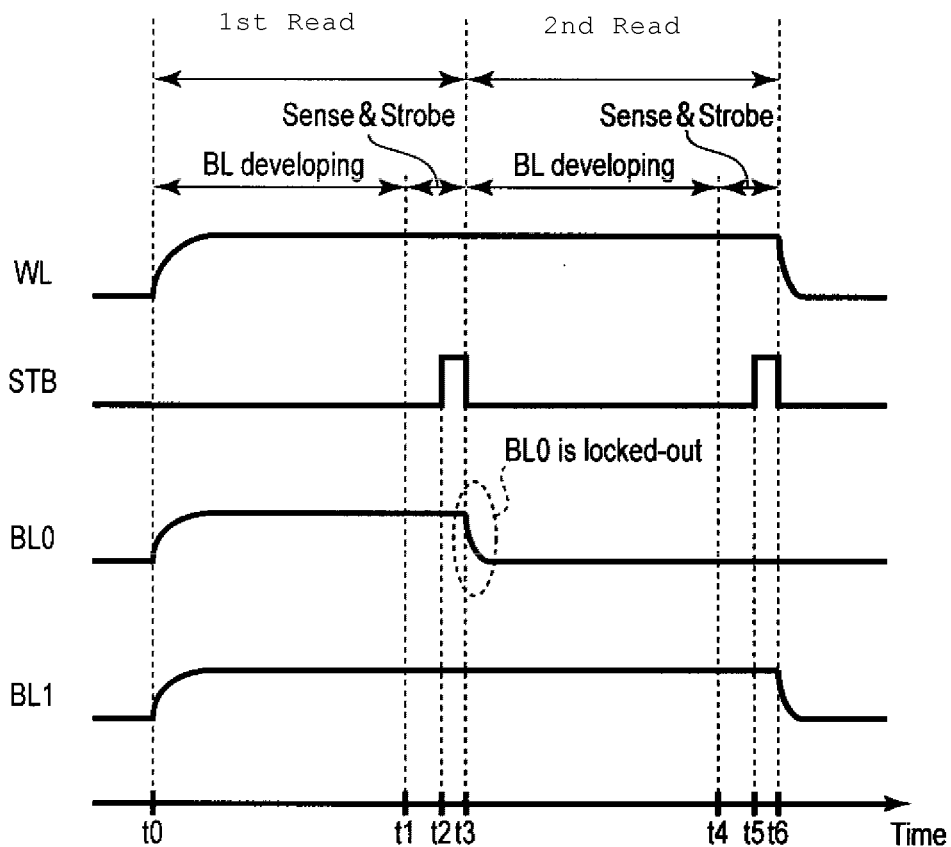
FIG. 5 is a timing chart of the potentials of nodes at during a data read method according to the embodiment.

FIG. 5 is a timing chart showing a specific example of the above-described double read method. Here, a case in which, of two bit lines BL0 and BL1, at the time of first read, a large cell current flows through the bit line BL0 and the read data from the bit line BL0 is determined to be "1"; on the other hand, a sufficient cell current does not flow through the bit line BL1 and the read data from the bit line BL1 is determined to be "0" is shown.

As shown in the drawing, at time t0, a voltage according to read data is applied to a selected word line, and the bit lines BL0 and BL1 are precharged. Then, after a lapse of a predetermined time, at time t1, the data is sensed, and, at time t2, the signal STB is made to take "H" level and the data is strobed. Then, since the data corresponding to the bit line BL0 is determined to be "1" data, the bit line BL0 is locked out, and the bit line BL0 is fixed at 0 V. On the other hand, the bit line BL1 is precharged again, and second read is performed. As for the bit line BL1, a judgment as to whether the read data is "0" or "1" is made based on the result of the second read.

2.2 Regarding Forecasting Sense

Figure 6:
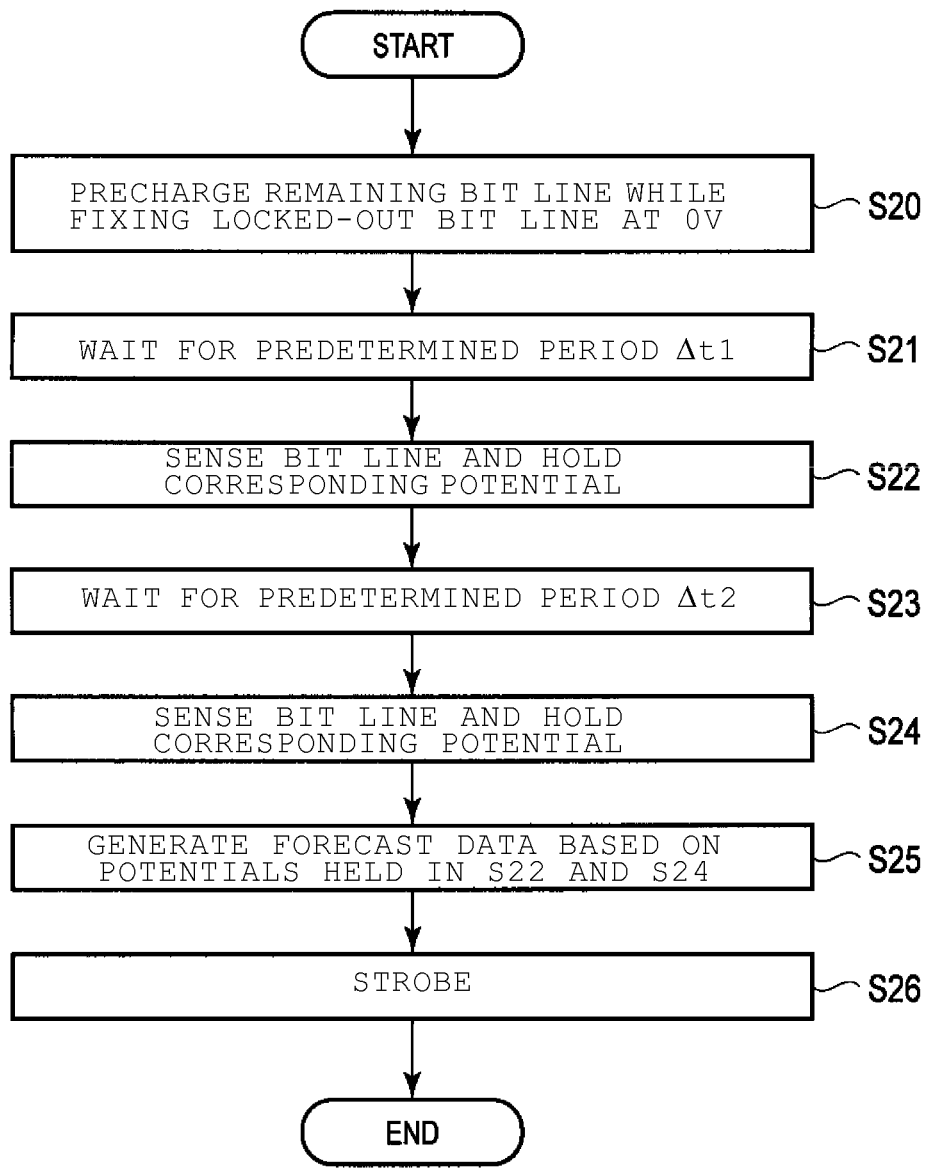
FIG. 6 is a more detailed flowchart of a portion of the data read method according to the embodiment.

In the read operation according to the embodiment, during the second read, data is forecasted by performing at least two sense operations, whereby the time required to perform the read is reduced. In the following description, this method is referred to as "forecasting sense". FIG. 6 is a flowchart showing the details of the second read operation. The operation shown in FIG. 6 is also performed based on the control by the control circuit 14, for example.

As shown in the drawing, the control circuit 14 precharges the remaining bit lines (the bit lines that were not locked out) while fixing the locked-out bit lines BL at 0 V (or a predetermined fixed potential) by controlling the bit line control section BL_CONT (Step S20).

Then, the control circuit 14 waits for a predetermined period Δt1 until the potential of the bit line BL is stabilized (Step S21), then senses the bit line BL, and makes the forecasting section FC hold a corresponding potential (Step S22).

The control circuit 14 then waits for a predetermined period Δt2 (Step S23), performs second sense, and makes the forecasting section FC hold a corresponding potential (Step S24). Then, the control circuit 14 makes the forecasting section FC generate forecast data based on the potentials held in Steps S22 and S24 (Step S25).

Then, the control circuit 14 transfers the forecast data generated in Step S25 to the latch circuit SDL by the strobe section SB (Step S26).

2.3 Regarding a Specific Example of Forecasting Sense

Figure 7:
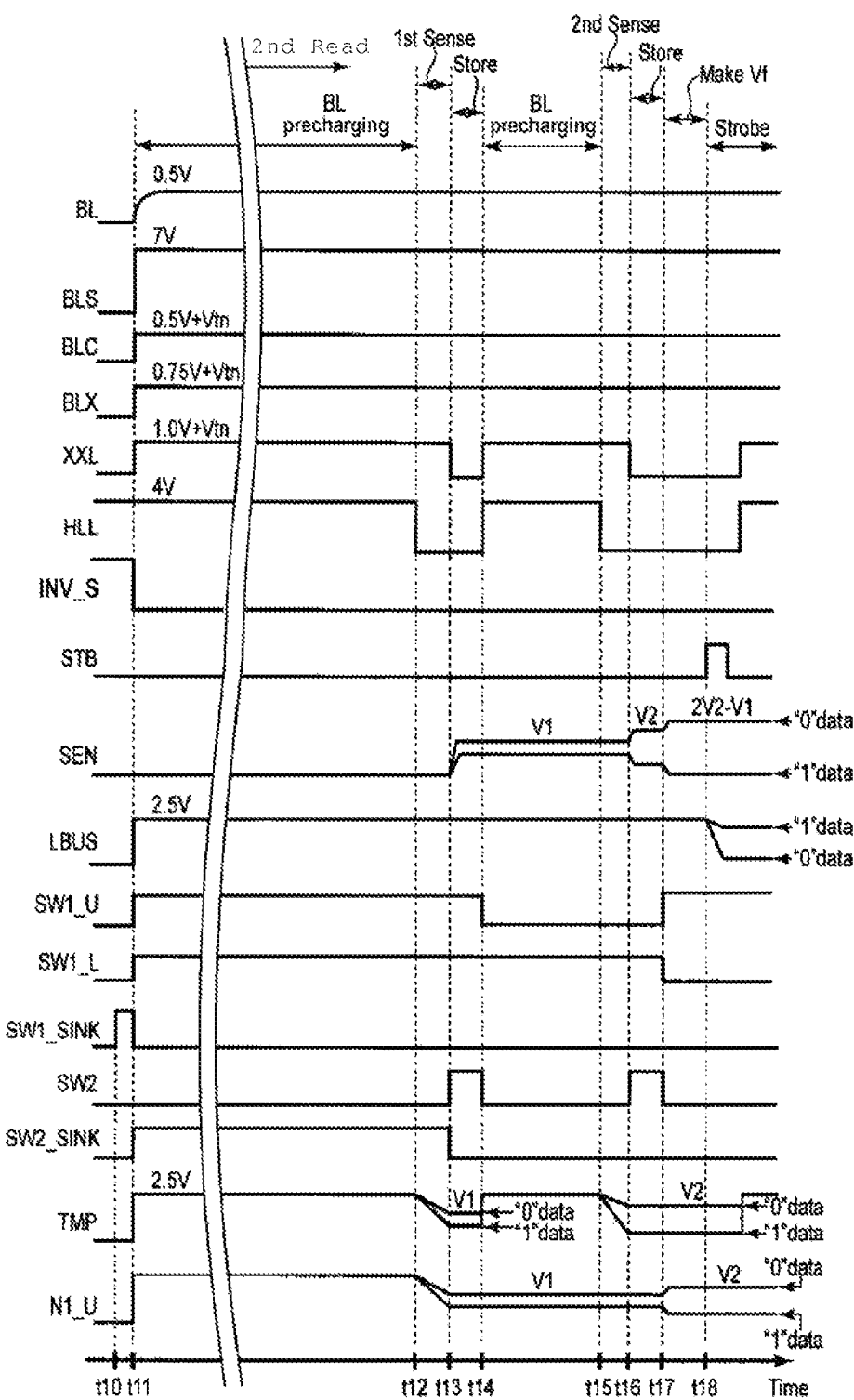
FIG. 7 is a more detailed timing chart of the potentials of nodes during a portion of the data read method according to the embodiment.

A specific example of the above-described forecasting sense will be described by using FIGS. 7 to 14. FIG. 7 is a timing chart showing the control signals and changes in the potentials of the nodes at the time of read, and FIGS. 8 to 14 are circuit diagrams of a partial region of the sense amplifier unit SAU.

Figure 8:
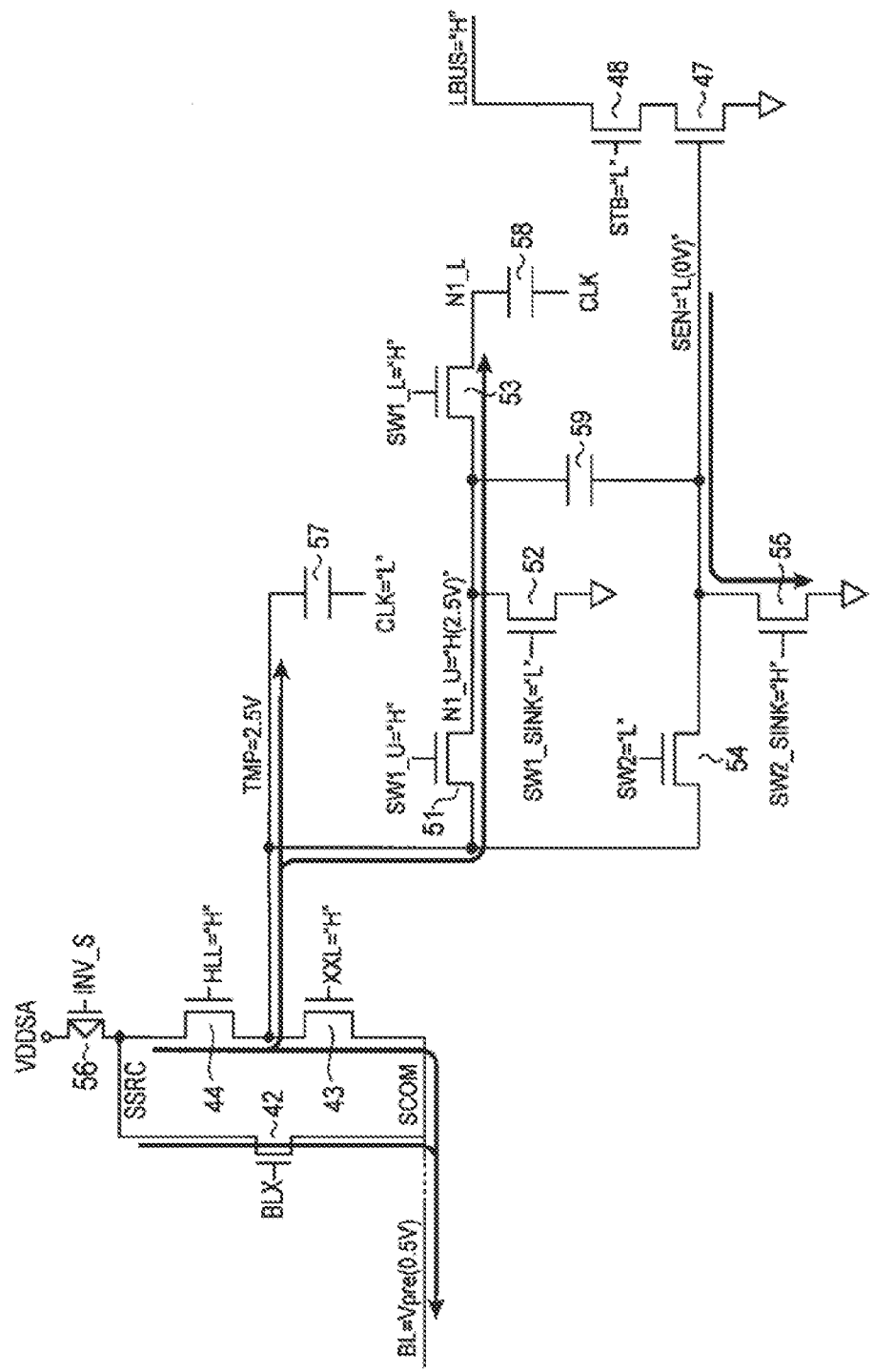
FIGS. 8-14 are each a circuit diagram of the sense amplifier unit according to the embodiment that illustrate current flows at various stages of the data read method.

As shown in a time period before time t12 of FIG. 7, the bit line BL is first precharged for second read. This state is shown in FIG. 8. As shown in FIGS. 7 and 8, the signals BLS, BLC, BLX are made to take "H" level, and the node INV_S is made to take "L" level in an initial state, whereby the bit line BL is precharged to 0.5 V, for example, via the current paths of the transistors 40 to 42 and 56.

At this time, as a result of the signal HLL also being made to take "H" level, the capacitor element 57 is charged, and the potential of the node TMP rises to about 2.5 V, for example. Furthermore, as a result of the signals SW1_U and SW1_L being made to take "H" level, the capacitor element 58 is charged, and the node N1_U is also charged to about 2.5 V, for example.

However, as a result of the signal SW2 being made to take "L" level and the signal SW2_SINK being made to take "H" level, the node SEN is fixed at "L" level (for example, 0 V).

Figure 9:
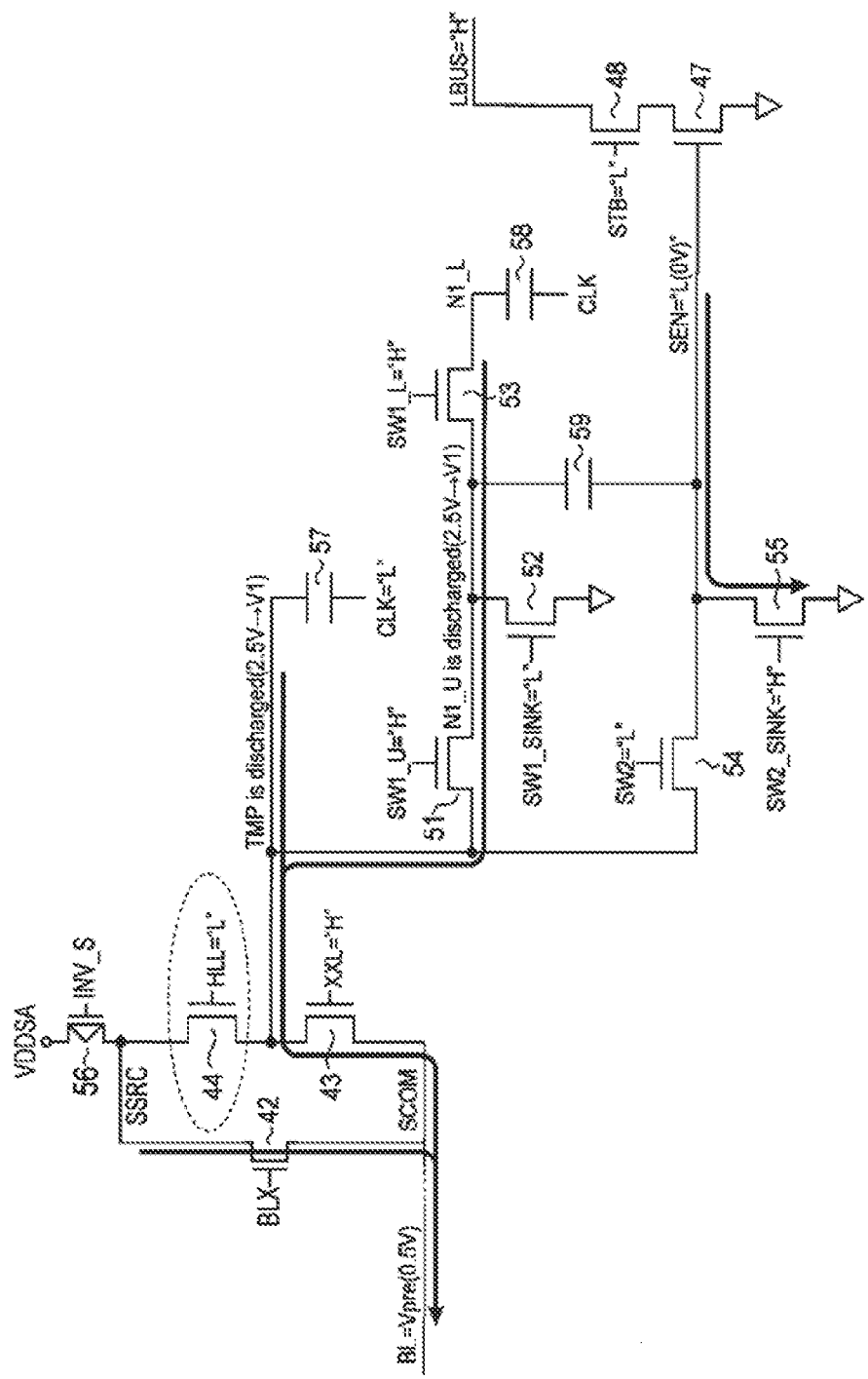

Next, after a lapse of the predetermined period Δt1, at the time t12, the signal HLL is made to take "L" level, and first sense of data is performed. This state is shown in FIG. 9. As shown in the drawing, as a result of the signal HLL being made to take "L" level and the signal XXL being made to take "H" level, the capacitor elements 57 and 58 are discharged in accordance with the current flowing through the bit line BL. As a result, the potentials of the nodes IMP and N1_U are lowered from 2.5 V to a certain potential V1. If the data held in the memory cell transistors is "1" data, a sufficiently large cell current flows from the bit line BL to the source line SL. As a result, the potential V1 is lowered to a satisfactory extent. On the other hand, if the held data is "0" data, the current flowing from the bit line BL to the source line SL is small. Therefore, the potential V1 becomes higher than the potential in the above-described case.

Figure 10:
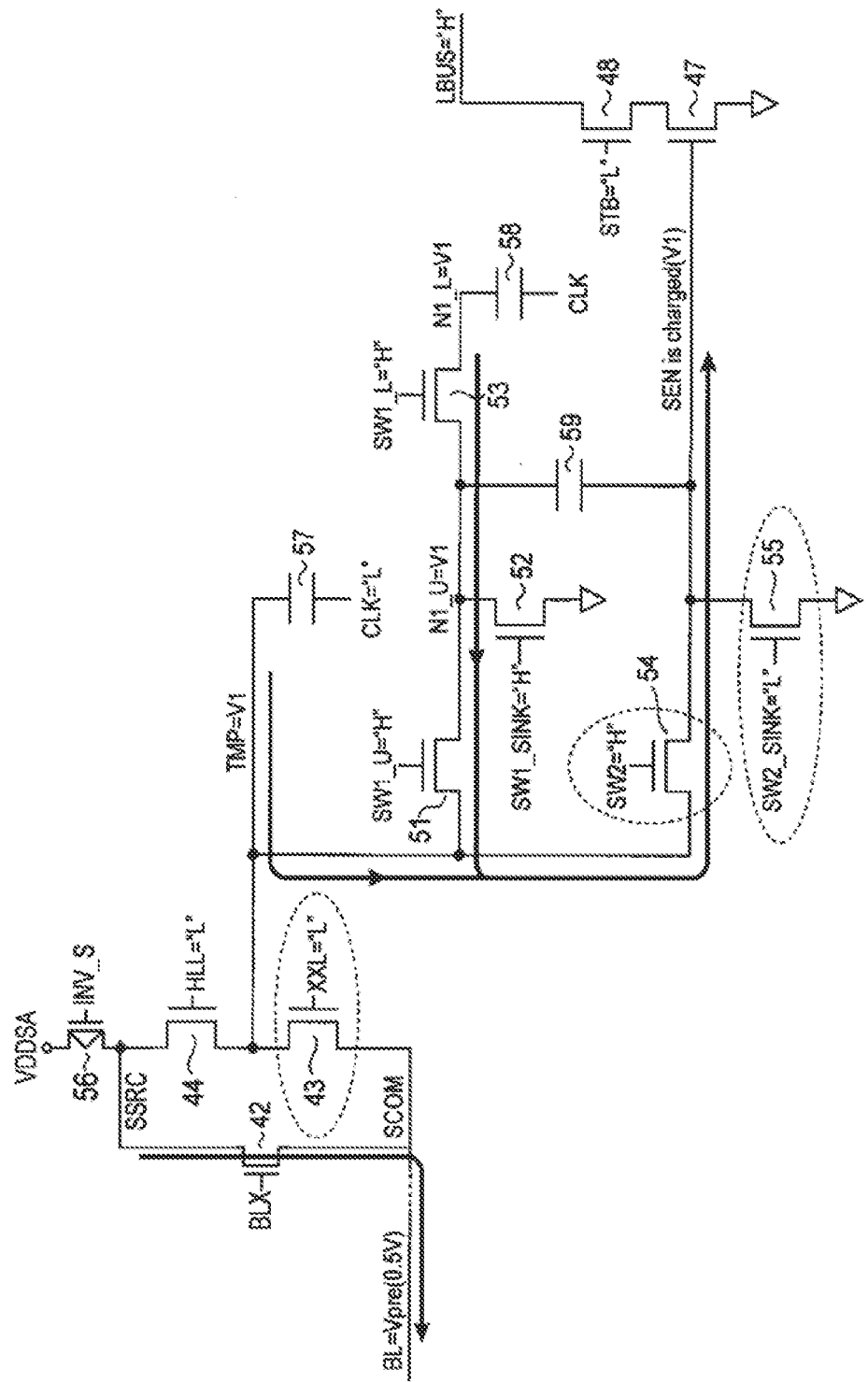

Next, at time t13, the sensed data is held in the node SEN. This state is shown in FIG. 10. As described in the drawing, at the time t13, the signal XXL is made to take "L" level to bring the transistor 43 into an OFF state, the signal SW2 is made to take "H" level to bring the transistor 54 into an ON state, and the signal SW2_SINK is made to take "L" level to bring the transistor 55 into an OFF state. As a result, the potentials V1 of the node TMP and N1_U are transferred to the node SEN.

Figure 11:
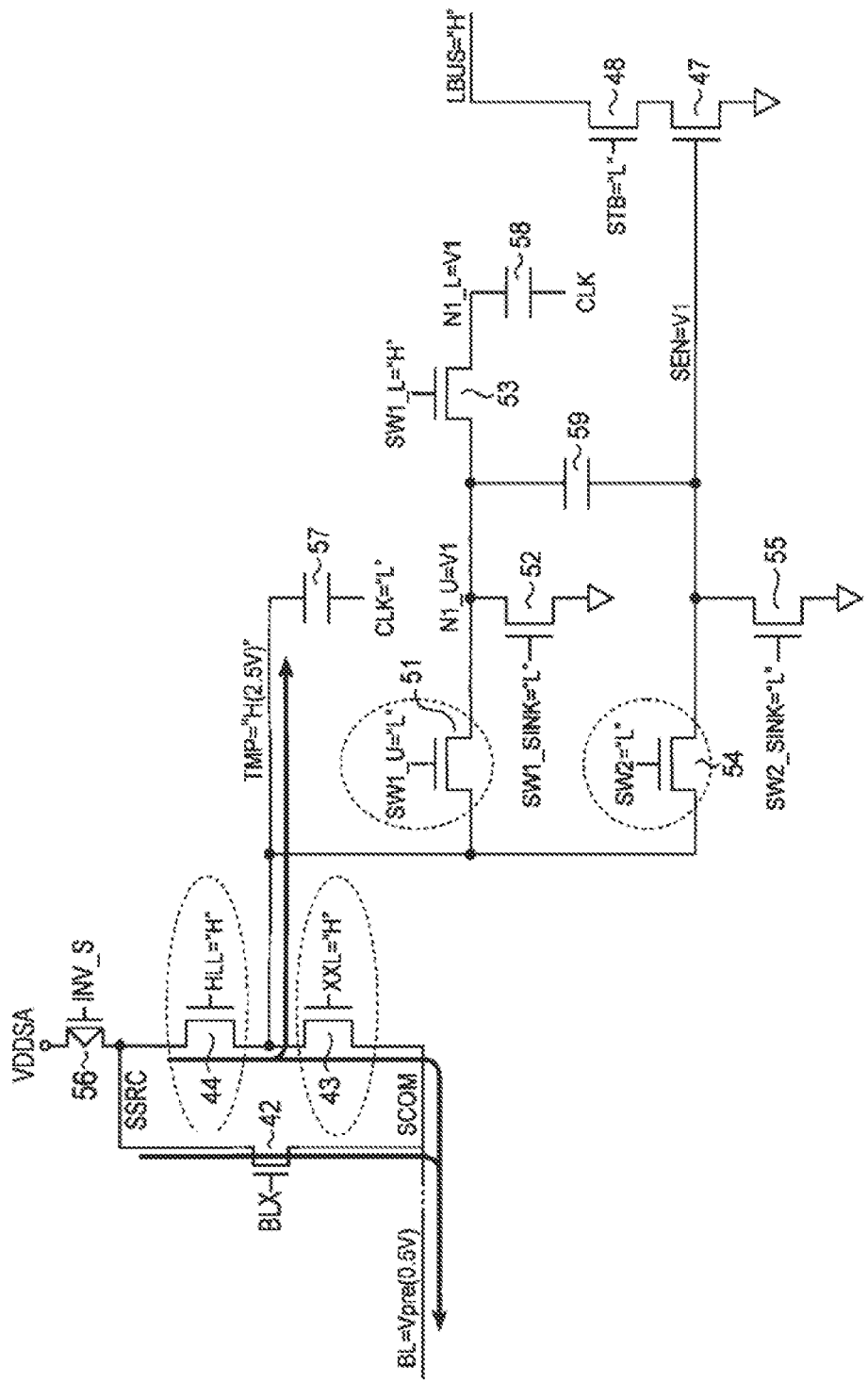

This is the end of the first data sense. Next, second data sense is started at time t14. For the second data sense, the control circuit 14 precharges the node TMP again. This state is shown in FIG. 11. As shown in the drawing, as a result of the signals HLL and XXL being made to take "H" level and the transistors 43 and 44 being brought into an ON state, the capacitor element 57 is charged, and the potential of the node TMP is charged to about 2.5 V again. The second sense differs from the first sense in that the signal SW1_U is made to take "L" level. This brings the transistor 51 into an OFF state, and the node N1_U is brought into a floating state at the potential V1. Moreover, since the signal SW2 is also made to take "L" level and the transistor 54 is brought into an OFF state, the node SEN is brought into a floating state at the potential V1.

Figure 12:
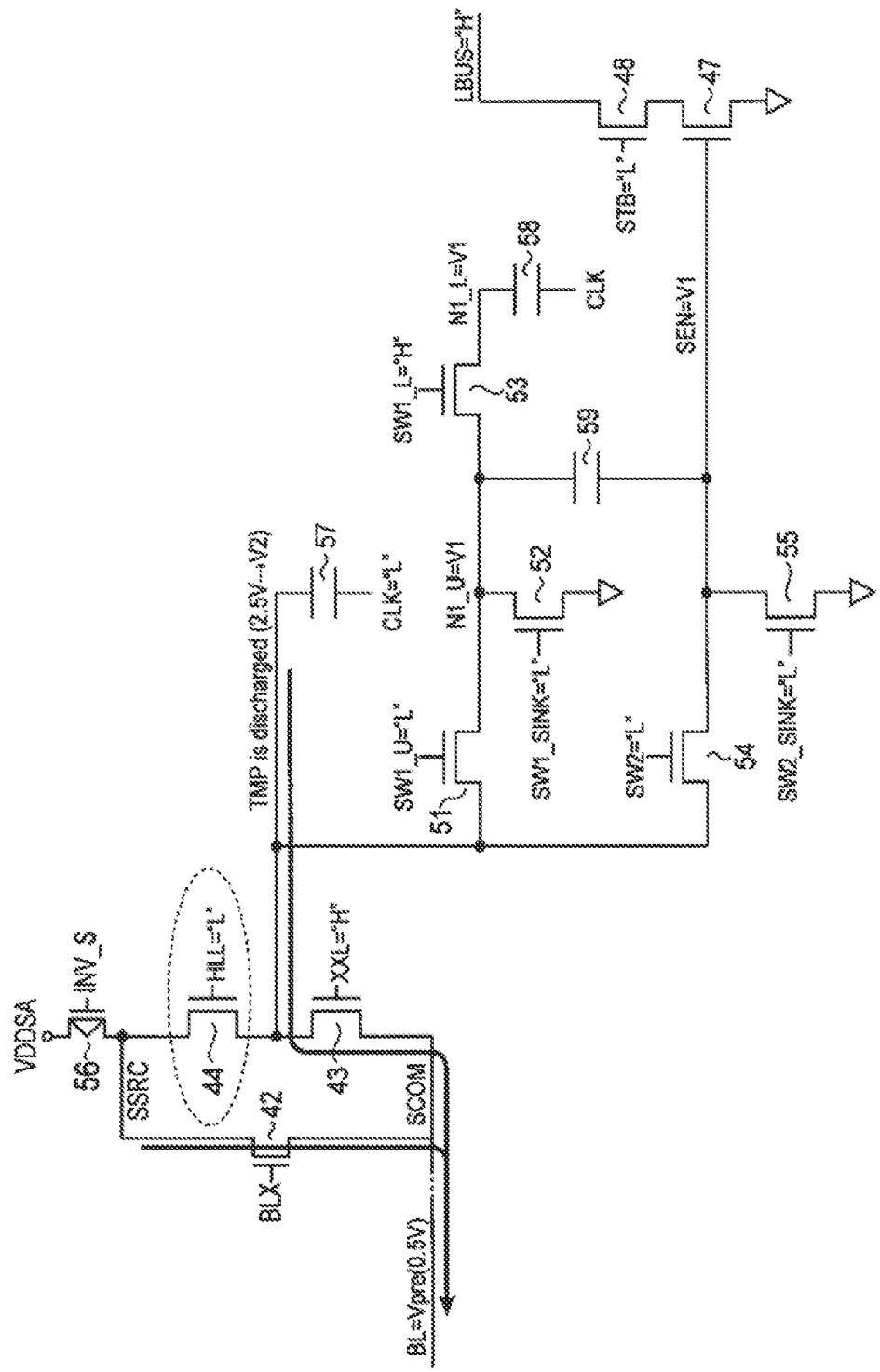

Next, after a lapse of the predetermined period Δt2, at time t15, the signal HLL is made to take "L" level, and second sense of data is performed. This state is shown in FIG. 12. As shown in the drawing, as a result of the signal HLL being made to take "L" level, the capacitor element 57 is discharged in accordance with the cell current flowing through the bit line BL. As a result, the potential of the node TMP is lowered from 2.5 V to a certain potential V2. At this point, the cell current flowing through the bit line BL is stabilized as compared to the cell current at the time of first sense (time t12 to t13). That is, if the data held by the memory cell transistors is "1" data, the current flowing from the bit line BL to the source line SL is larger than the current at the time of first sense. Therefore, the potential V2 in this case is lower than the potential V1 obtained at the time of first sense. On the other hand, if the held data is "0" data, the current is smaller than the current at the time of first sense. Therefore, the potential V2 in this case is higher than the potential V1 obtained at the time of first sense.

Figure 13:
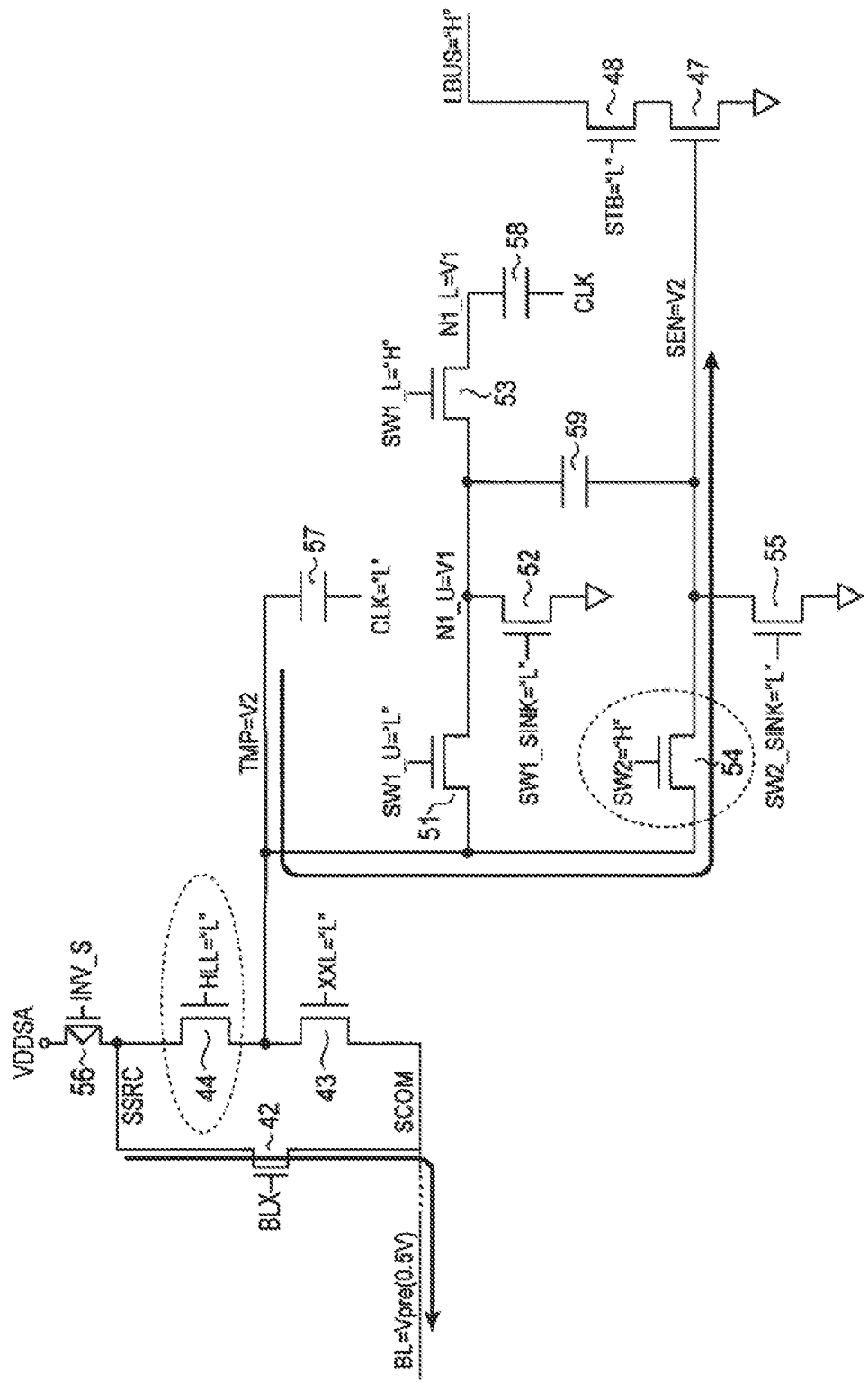

Next, at time t16, the sensed data is held in the node SEN. This state is shown in FIG. 13. As shown in the drawing, at the time t16, the signal XXL is made to take "L" level, and the transistor 43 is brought into an OFF state. Then, the signal SW2 is made to take "H" level and the transistor 54 is brought into an ON state, whereby the potential V2 of the node TMP is transferred to the node SEN.

Figure 14:
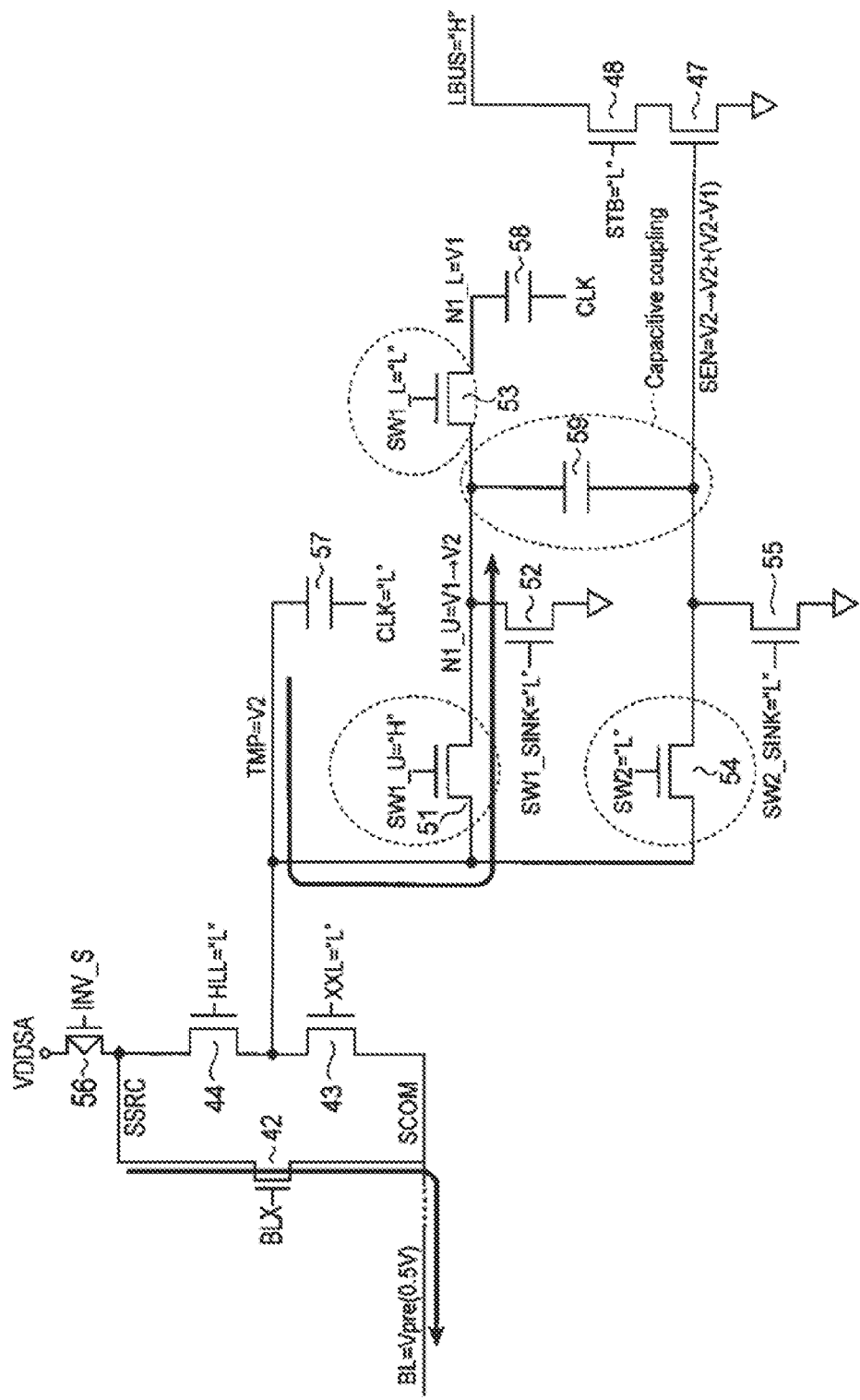

Next, forecast data is generated. This state is shown in FIG. 14. As shown in the drawing, at time t17, while the signal SW2 is made to take "L" level, the signal SW1_U is made to take "H" level. As a result, the potential V2 of the node TMP is transferred to the node N1_U. That is, the potential of the node N1_U undergoes a change from V1 to V2. Then, due to capacitive coupling by the capacitor element 59, the potential of the node SEN undergoes a change by an amount corresponding to the change (V2−V1). That is, the potential of the node SEN changes from V2 to V2+(V2−V1)=2·V2−V1.

Then, the signal STB is made to take "H" level, and the forecast data thus obtained is transferred to the latch circuit SDL via the bus LBUS. That is, as shown in FIG. 7, if the data held by the memory cell transistors is "0" data, the potential of the node SEN is supposed to be sufficiently high. In this case, the transistor 47 is brought into an ON state, and "L" level is stored in the latch circuit SDL. On the other hand, if the data held by the memory cell transistors is "1" data, the potential of the node SEN is supposed to be sufficiently low. In this case, the transistor 47 is brought into an OFF state, and "H" level of the initial data is continuously held in the latch circuit SDL. Incidentally, during the above-described operation, the clock CLK keeps "L" level (0 V), for example.

3. Advantage of the Embodiment

With the configuration of the embodiment, the operation speed of the NAND flash memory can be improved. This advantage will be described below.

In the read operation of the NAND flash memory, the waiting time for the fluctuations in a current and a voltage of a bit line to be stabilized represents a large portion of the time required to perform the read. If the waiting time is not long enough, sense is performed while the bit line is fluctuating as a result of factors other than a cell current. As a result, the current observed by the sense amplifier is different from an original cell current, which may cause an erroneous sense. Since, in general, as the cell current becomes smaller and the bit line capacity in which an adjacent capacity is predominant is increased with miniaturization of wires, the waiting time described above is increased, leading to a slowdown in speed.

Thus, in the embodiment, even when the waiting time for the fluctuations in a current and a voltage of a bit line to be stabilized is not sufficient, a current which would have been observed by the sense amplifier when a final waiting time, which is originally needed, elapses, is forecasted based on the information on the trend in the fluctuations. As such, "forecasting sense", sense that is performed before the final waiting time elapses, is performed.

Figure 15:
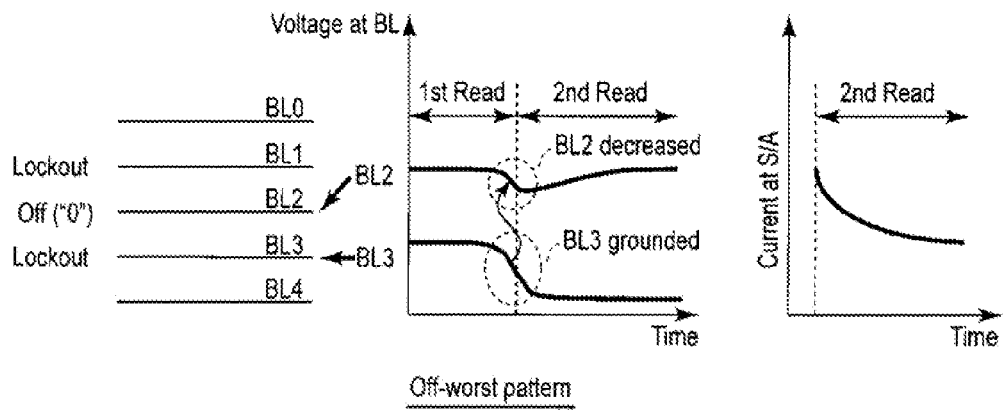
FIG. 15 is a schematic diagram showing fluctuations in a voltage and a current of a bit line at the time of lockout of the bit line from which "0" data is read.
Figure 16:
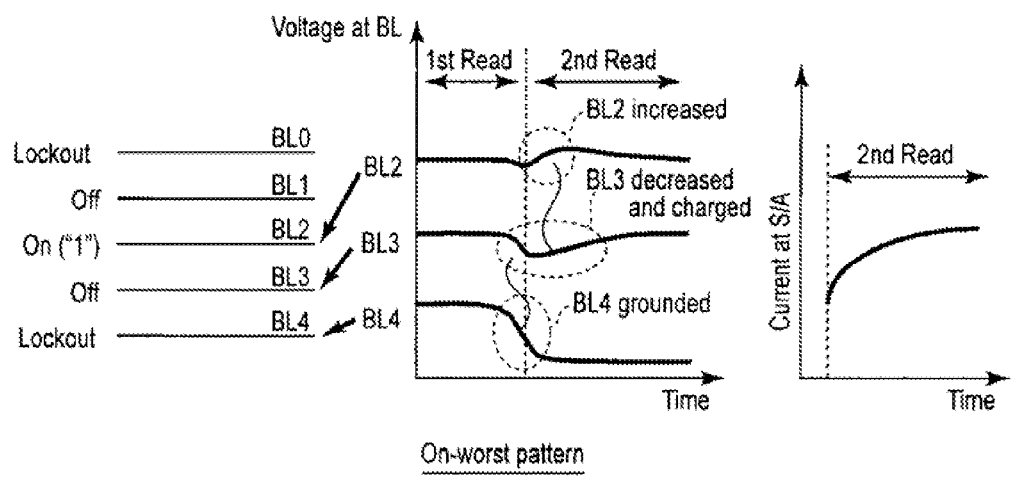
FIG. 16 is a schematic diagram showing fluctuations in a voltage and a current of a bit line at the time of lockout of the bit line from which "1" data is read.

In the double read method described in FIGS. 4 and 5, in each of the first read and the second read, data sense has to be performed after fluctuations in a current and a voltage of the bit line BL are suppressed. This waiting time is a time period written as "BL developing" in FIGS. 5 and 7. In addition, the waiting time, in particular, at the time of second read differs depending on a data pattern, and the waiting time becomes sometimes especially long for a particular data pattern. This will be described by using FIGS. 15 and 16. FIGS. 15 and 16 are schematic diagrams showing read data patterns, bit line voltages, and bit line currents observed by the sense amplifier.

FIG. 15 focuses attention on a bit line from which "0" data is read, and FIG. 16 focuses attention on a bit line from which "1" data is read.

First, an example of FIG. 15 will be described. In the example of FIG. 15, a state in which the bit lines BL1 and BL3 are locked out at the completion of first read and second read is performed on the bit line BL2 that has "0" data (OFF cell) sandwiched between the bit lines BL1 and BL3 is shown. Since "0" data is read from the bit line BL2, ideally, almost no current flows through the bit line BL2 (OFF current constant) and the potential of the bit line BL2 is supposed to be constant at a precharge potential provided from the sense amplifier.

However, at the moment when the bit lines BL1 and BL3 which are next to the bit line BL2 are locked out, the potential of the bit line BL2 is lowered due to coupling between the bit lines BL1 and BL3. That is, to the sense amplifier, it seems as if the bit line BL2 is an ON cell ("1" data) because of a large current temporarily flowing therethrough. Then, the current of the bit line BL2 decreases and approaches an original OFF cell current value, and the potential of the bit line BL2 also rises toward a precharge potential.

In an example of FIG. 16, a state in which the bit lines BL0 and BL4 are locked out at the completion of first read, second read is performed on the bit lines BL1 to BL3 sandwiched between the bit lines BL0 and BL4, "1" data is read from the bit line BL2, and "0" data is read from the bit lines BL1 and BL2 is shown.

Since "1" data is read from the bit line BL2, ideally, a large ON current flows through the bit line BL2 and the potential of the bit line BL2 is supposed to be constant at a precharge potential.

However, at the moment when the bit line BL4 is locked out, the potential of the bit line BL3 is lowered due to coupling between the bit line BL3 and the bit line BL4 and then rises. Then, the potential of the bit line BL2 also rises due to coupling between the bit line BL2 and the bit line BL3. The bit line BL2 is similarly influenced also by the bit lines BL0 and BL1. As a result, to the sense amplifier, it seems as if the bit line BL2 is an OFF cell ("0" data) because of a small current flowing therethrough. Then, the current of the bit line BL2 increases and approaches an original ON cell current value, and the potential of the bit line BL2 is also lowered toward a precharge potential.

Figure 17:
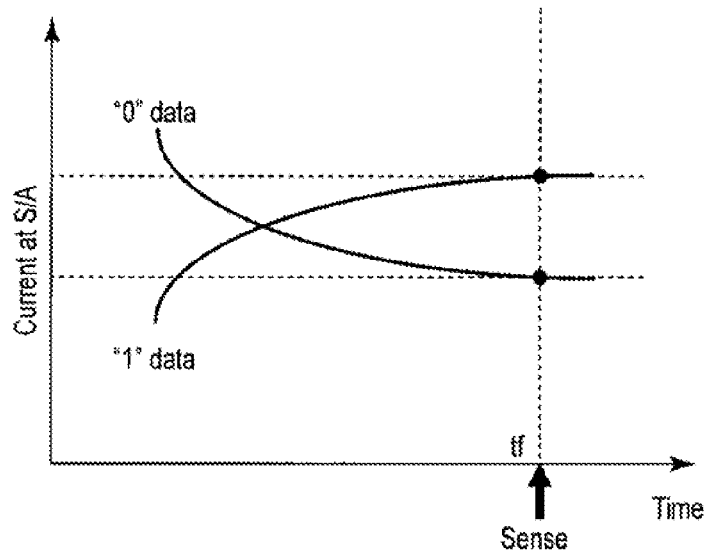
FIG. 17 is a graph showing a change in a current flowing through a sense amplifier with time.

As described above, the waiting time at the time of read is caused by the influence of coupling between the bit lines, and a long waiting time of about several microseconds is required before actual sense is performed. This state is shown in FIG. 17. FIG. 17 is a graph showing a change in a bit line current with time, the change observed by the sense amplifier. As shown in the drawing, irrespective of whether the current of a bit line is "0" data or "1" data, a sense operation is performed after a time required to stabilize the current elapses (time tf). If there is not enough waiting time, sense is performed while the bit line is fluctuating by a factor other than a cell current, which may result in erroneous judgment of data.

Figure 18:
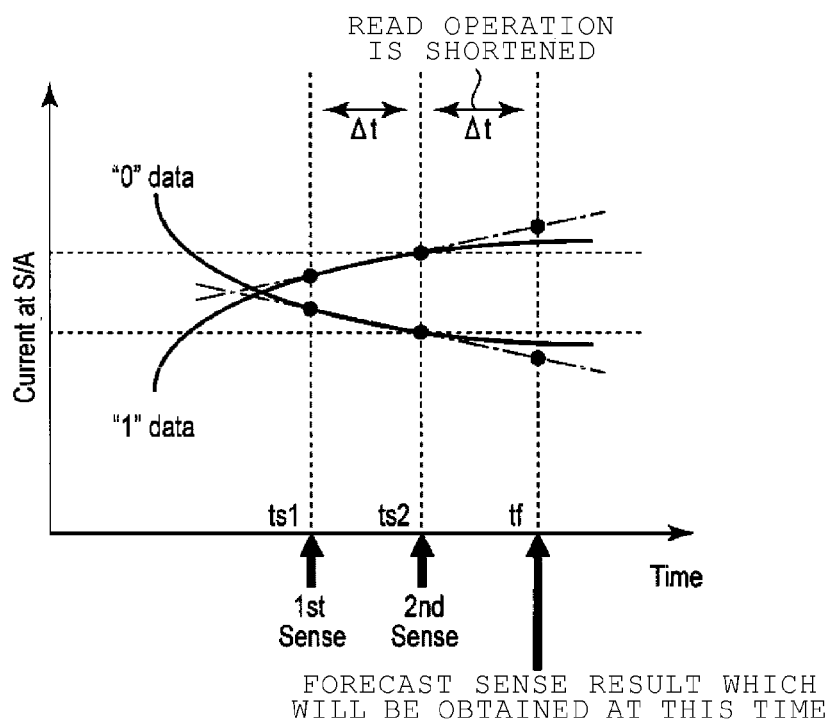
FIG. 18 is a graph showing a change in a current flowing through the sense amplifier with time.

However, the manner in which a current and a voltage of a bit line fluctuate gets closer to monotone increasing or monotone decreasing because the coefficient of fluctuation thereof converges at a constant coefficient after a lapse of a certain time. Therefore, in the embodiment, a plurality of sense operations are performed when the coefficient of fluctuation approaches the constant coefficient, and a current which will be observed by the sense amplifier after a lapse of an originally required final waiting time is forecasted based the obtained result. Then, based on this forecasted current, sense is performed before a lapse of the final waiting time. This state is shown in FIG. 18. FIG. 18 is a graph showing a change in a bit line current with time, the change observed by the sense amplifier.

As shown in the drawing, in the embodiment, two sense operations are performed when the rate of change of voltage fluctuation of a bit line becomes to some extent constant (time ts1 and time ts2). However, ts2=ts1+$\Delta$t. Assume that voltages at a sense node (the node SEN of FIG. 3) after current sense at the time ts1 and time ts2 are V1 and V2, respectively, and tf=ts1+2·$\Delta$t1. Then, a voltage Vf at the sense node at the time tf is approximately Vf=V2+(V2−V1)=2·V2−V1. Thus, the forecasting section FC of the sense amplifier module SAU generates the voltage Vf at the time ts2 after completion of second sense and senses this voltage. As a result, a sense operation can be performed at a time point before the time tf, and, as shown in FIG. 18, the read operation can be shortened by $\Delta$t.

Moreover, in an extra-high density three-dimensional stacked NAND flash memory, the magnitude of a cell current to be read is a level of tens of nA and is extremely low. Furthermore, the number of sense amplifier modules SAU is a few KB and is large. Therefore, using a mirror circuit or the like in the forecasting section FC is not easy. Thus, in the embodiment, the sensed current is converted into an analog voltage value and taken into a capacitive element, and, at each sense, a computation of the result thereof is performed by using a voltage of an analog value. By doing so, a forecasted sense voltage, the voltage which will be observed after a lapse of the final waiting time, is obtained at the sense node SEN.

In addition, the sense amplifier module 11 can be formed in a lower part of the memory cell array 10. That is, the sense amplifier module 11 and the memory cell array 10 are stacked on the semiconductor substrate. Therefore, even when the size of the sense amplifier module 11 is increased as a result of the forecasting section FC being provided, this has little effect on an increase in chip size.

4. Modified Examples Etc.

As described above, the semiconductor storage according to the embodiment includes memory cells, a bit line, and a sense amplifier. The memory cells are stacked on a semiconductor substrate. The bit line is electrically connected to the memory cells and is capable of transferring data. The sense amplifier reads data from the memory cells. The sense amplifier includes first to sixth transistors (Tr42, Tr44, Tr43, Tr51, Tr54, and Tr47 in FIG. 3). The first transistor (Tr42) precharges the bit line. The second transistor (Tr44) charges a first node (TMP in FIG. 3). The third transistor (Tr43) connects the bit line to the first node (TMP). The fourth transistor (Tr51) connects the first node (TMP) to a second node (N1_U). The fifth transistor (Tr54) connects the first node (TMP) to a third node (SEN). The sixth transistor (Tr47) senses read data in accordance with the potential of the third node (SEN). Then, at the time of reading of data, (1) gate signals (BLX, HLL, XXL, and SW1_U) of the first to fourth transistors (Tr42 to Tr44 and Tr51) are asserted (to t12 in FIGS. 7 and 8: 1st precharge), (2) the gate signal (HLL) of the second transistor (Tr44) is then negated (t12 to t13 in FIGS. 7 and 9: discharge and store V1 to N1_U), (3) the gate signal (SW1_U) of the fourth transistor (Tr51) is then negated and, at the same time, the gate signal (HLL) of the second transistor (Tr44) is asserted (t14 to t15 in FIGS. 7 and 11: 2nd precharge), (4) the gate signal (HLL) of the second transistor (Tr44) is then negated (t15 to t16 in FIGS. 7 and 12: discharge), (5) a gate signal (SW2) of the fifth transistor (Tr54) is then asserted in a state in which the gate signals (XXL and SW1_U) of the third and fourth transistors (Tr43 and Tr51) are negated (t16 to t17 in FIGS. 7 and 13: transfer V2 to SEN), and (6) the gate signal (SW1_U) of the fourth transistor (Tr51) is then asserted (t17 to t18 in FIGS. 7 and 14: generate forecast data). Incidentally, to "assert" means that a signal is made to be valid, which indicates logic "H" level in the case of a gate signal of an n-channel MOS transistor, for example, and indicates logic "L" level in the case of a p-channel MOS transistor. On the other hand, to "negate" means that a signal is made to be invalid, which indicates logic "L" level in the case of a gate signal of an n-channel MOS transistor, for example, and indicates logic "H" level in the case of a p-channel MOS transistor.

With this configuration, the operation reliability of the semiconductor storage can be improved. Incidentally, the embodiment is not limited to the form described above and can be modified in various ways. For example, as described in FIGS. 4 and 5, the above-described embodiment deals with a case in which forecasting sense is used at the time of second read in the double read method. However, the forecasting sense may be applied at the time of first read or may be applied at the time of both first and second read. Moreover, the forecasting sense may be applied, not to the double read method, but to a method in which data of all the bit lines is determined by one read operation.

Moreover, in the above-described embodiment, as described in FIG. 18, for example, forecast data is generated by two sense operations. However, the forecast data may be generated by three or more sense operations. The more the sense operations are performed, the higher the precision of forecast data can be. Furthermore, the configuration of the forecasting section FC that generates forecast data is not limited to the configuration described in FIG. 3, and the forecasting section FC may be formed of a digital circuit and the like, for example. In addition, a specific method for generating forecast data is not limited to the embodiment described above, and the potential of the sense node SEN in FIGS. 8 and 9 is not limited to 0 V and may be fixed at other potentials.

Figure 19:
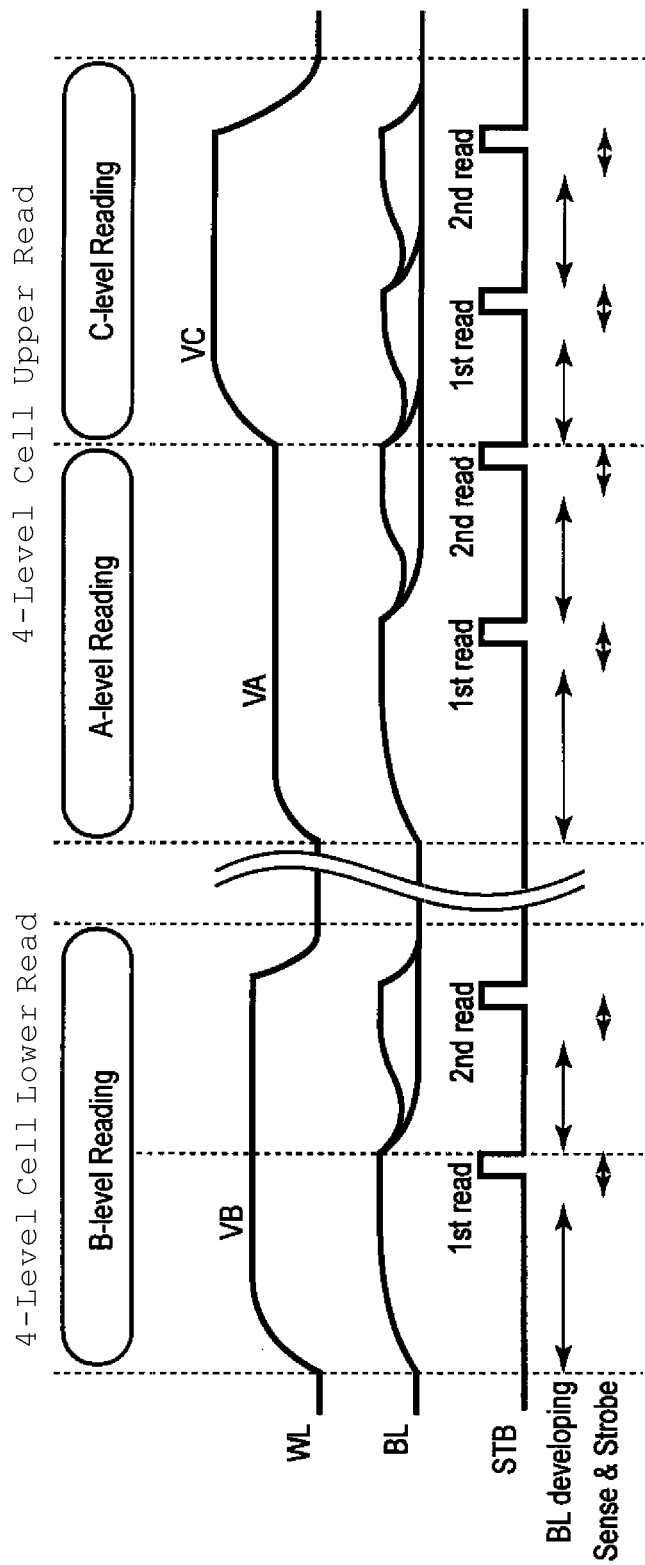
FIG. 19 is a timing chart of the potentials of nodes at the time of data reading according to a modified example of the embodiment.

In addition, the above-described embodiment may be a multi-level cell (MLC) type in which each memory cell transistors can hold 2 bits or more of data. FIG. 19 is a timing chart showing a double read method when each memory cell transistor holds 2-bit data, in other words, when each memory cell transistor can have four threshold levels (EP level, A level, B level, and C level in ascending order of threshold value).

As shown in the drawing, reading of lower-order bits is first performed. That is, a voltage VB for distinguishing between A level and B level is applied to a selected word line WL, and two read operations are performed. Next, reading of higher-order bits is performed. First, a voltage VA for distinguishing between EP level and A level is applied to the selected word line WL, and a determination is made as to whether the threshold value is EP level or A level for the memory cells that are turned on at the time of reading of lower-order bits. Then, a voltage VC for distinguishing between B level and C level is applied to the selected word line WL, and a determination is made as to whether the threshold value is B level or C level for the memory cells that are turned off at the time of reading of lower-order bits.

In such a case, the forecasting sense described above can be applied to both reading of lower-order bits and reading of higher-order bits.

Moreover, the above-described embodiment deals with a three-dimensional stacked NAND flash memory as an example of a semiconductor storage. The three-dimensional stacked structure is not particularly limited to a predetermined structure and may be simply a configuration equivalent to the circuit shown in FIG. 2. For example, the three-dimensional stacked structure may be a configuration in which the transistors MT0 to MT7 are stacked in a vertical direction of the semiconductor substrate or a configuration in which the transistors MT0 to MT8 connected in series are arranged above the semiconductor substrate in the shape of the letter U. Moreover, the above-described embodiment is not limited to a three-dimensional stacked type and can also be applied to an existing NAND flash memory or the like in which memory cells are two-dimensionally arranged in a plane of a semiconductor substrate.

Figure 20:
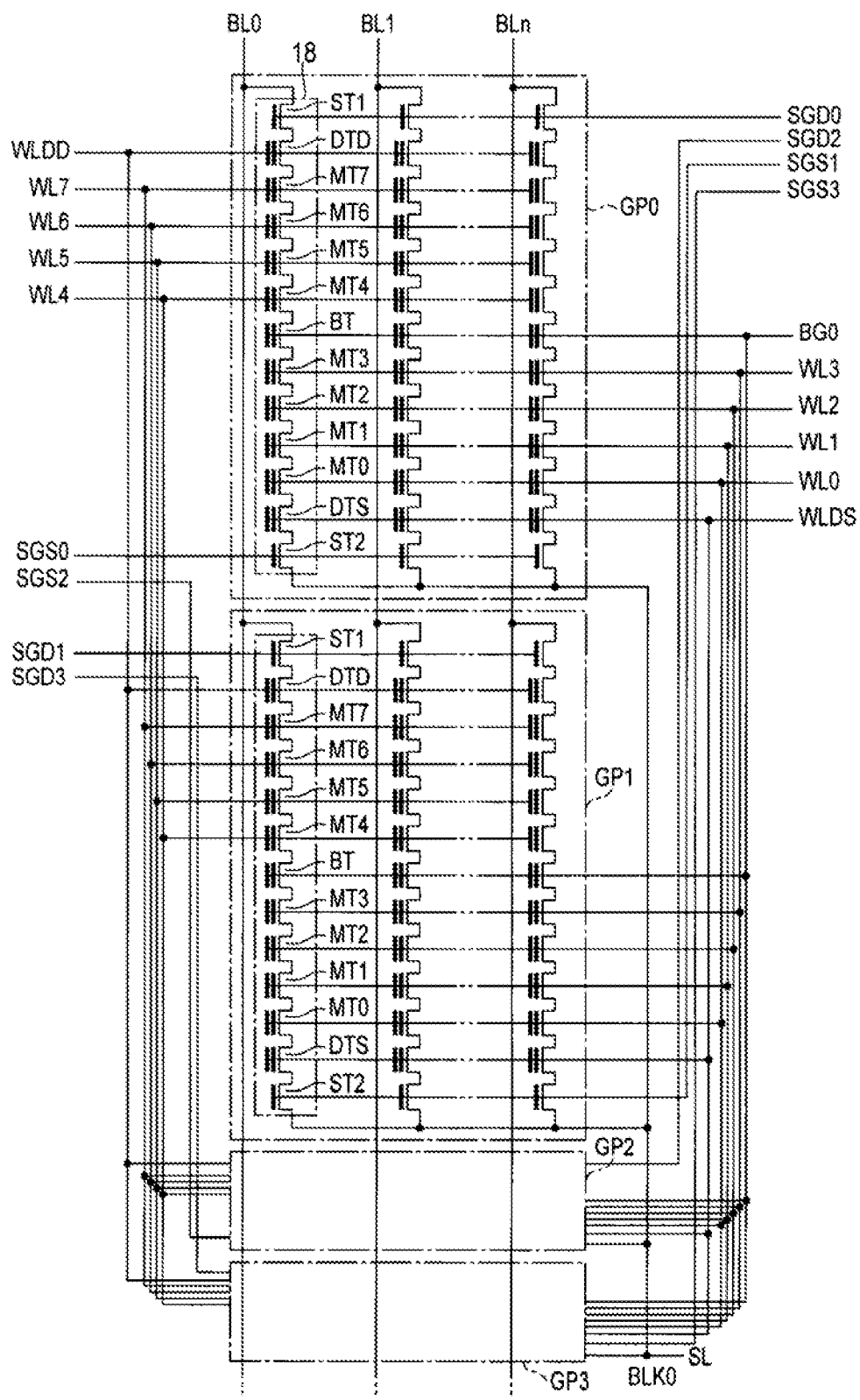
FIG. 20 is a circuit diagram of a memory cell array according to a modified example of the embodiment.

Furthermore, the memory cell array shown in FIG. 2 may have a configuration of FIG. 20. FIG. 20 is a circuit diagram of the block BLK0, and other blocks BLK can also have the same configuration. As shown in the drawing, each memory group GP has dummy word lines WLDD and WLDS which are next to the select gate lines SGD and SGS. In addition, the word lines WL0 to WL3, the dummy word line WLDD next to the word line WL0, the back-gate line BG, even-numbered select gate lines SGD0 and SGD2, and odd-numbered select gate lines SGS1 and SGS3 are drawn to one end of the memory cell array 10. On the other hand, the word lines WL4 to WL7, the dummy word line WLDS next to the word line WL7, even-numbered select gate lines SGS0 and SGS2, and odd-numbered select gate lines SGD1 and SGD3 are drawn to the other end of the memory cell array, the other end on the side opposite to the one end. Such a configuration may be adopted. In this configuration, for example, a row decoder that selects the word line WL may be divided into two row decoders and the two row decoders may be disposed in such a way as to face each other with the memory cell array 10 sandwiched between the two row decoders. In addition, one row decoder may be made to select the select gate lines SGD0, SGD2, SGS1, and SGS3, the word lines WL0 to WL3, the dummy word line WLDD, and the back-gate line BG, and the other row decoder may be made to select the select gate lines SGS0, SGS2, SGD1, and SGD3, the word lines WL4 to WL7, and the dummy word line WLDS. With this configuration, an overcrowded state of wiring lines such as select gate lines and word lines in a region between row-based peripheral circuits (such as a row decoder and a row driver) and the memory cell array 10 can be mitigated.

In addition, the above-described embodiment is not limited to a NAND flash memory and can be applied to storages in general provided with a single-end sense amplifier, for example. As an example, the above-described embodiment can also be applied to resistance random access memory (ReRAM) and so forth.

Moreover, the potentials of the signals described in the above-described embodiment are mere examples and are not limited to the values described above as long as the signals can fulfill the functions thereof. Furthermore, in the flowcharts described in the above-described embodiment, the sequence of processes may be changed wherever possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage comprising:
   a plurality of memory cells formed above a semiconductor substrate;
   a plurality of bit lines electrically connected to the memory cells;
   a plurality of sense amplifiers electrically connected to the plurality of the bit lines, each of the sense amplifiers including a first transistor that controls precharging of the bit line, a second transistor that controls a charging of a first node, a third transistor that controls a connection of the bit line to the first node, a fourth transistor that controls a connection of the first node to a second node, a fifth transistor that controls a connection of the first node to a third node, and a sixth transistor that is controlled by a potential of the third node; and
   a controller configured to control the first through sixth transistors to perform a read operation based on the potential of the third node, wherein during the read operation:
   (1) the first through fourth transistors are turned on during a first time period,
   (2) the second transistor is turned off in a second time period after the first time period,
   (3) the second transistor is turned on and the fourth transistor is turned off in a third time period after the second time period,
   (4) the second transistor is turned off in a fourth time period after the third time period,
   (5) the third and fourth transistors are turned off and the fifth transistor is turned on in the fifth time period after the fourth time period, and
   (6) the fourth transistor is turned on in a sixth time period after the fifth time period, wherein a first voltage is kept during the read operation, the first voltage being applied to a gate of a selected memory cell.

2. The semiconductor storage according to claim 1, further comprising:
   a capacitor between the second node and the third node.

3. The semiconductor storage according to claim 2, wherein
   the sense amplifier further includes a seventh transistor that controls a connection of the sixth transistor to a latch circuit, and
   the sixth transistor is turned on in a seventh time period after the sixth time period.

4. The semiconductor storage according to claim 3, wherein
   during the first and second time periods, the potential of the third node is fixed at a first voltage.

5. The semiconductor storage according to claim 4, wherein
   during the second time period and before the third time period, the fourth and fifth transistors are turned on while the third transistor is off.

6. The semiconductor storage according to claim 5, wherein
   the fourth transistor is turned on while the fifth transistor is turned off and the third node is in an electrically floating state.

7. The semiconductor storage according to claim 6, wherein a read result of the read operation is determined based on the potential of the third node in the fifth period and the potential of the third node in the second time period after the fifth transistor is turned on.

8. The semiconductor storage according to claim 1, wherein a read result of the read operation is determined based on the potential of the third node in the fifth period.

9. A semiconductor storage comprising:
   a plurality of memory cells formed above a semiconductor substrate;
   a bit line electrically connected to the memory cells;
   a sense amplifier electrically connected to the bit line and having a plurality of transistors that are controlled to perform sense operations to read data stored in the memory cells; and
   a controller configured to control the transistors of the sense amplifier to perform a read operation that includes a first sense operation and a second sense operation and determine the data stored in the memory cells based on a voltage V3 equal to 2*V2−V1, where V1 is a voltage sensed during the first sense operation and V2 is a voltage sensed during the second sense operation.

10. The semiconductor storage according to claim 9, wherein the data is determined to be 0 if V3 is above a predetermined voltage level and to be 1 if V3 is below the predetermined voltage level.

11. The semiconductor storage according to claim 9, wherein the sense amplifier includes a first transistor that controls precharging of the bit line, a second transistor that controls a charging of a first node, a third transistor that controls a connection of the bit line to the first node, a fourth transistor that controls a connection of the first node to a second node, a fifth transistor that controls a connection of the first node to a third node, and a sixth transistor that is controlled by a potential of the third node.

12. The semiconductor storage according to claim 11, wherein the controller is configured to control the first through sixth transistors to perform a read operation based on the potential of the third node, wherein during the read operation:
   (1) the first through fourth transistors are turned on during a first time period,
   (2) the second transistor is turned off in a second time period after the first time period,
   (3) the second transistor is turned on and the fourth transistor is turned off in a third time period after the second time period,
   (4) the second transistor is turned off in a fourth time period after the third time period,
   (5) the third and fourth transistors are turned off and the fifth transistor is turned on in the fifth time period after the fourth time period, and
   (6) the fourth transistor is turned on in a sixth time period after the fifth time period.

13. The semiconductor storage according to claim 12, further comprising:
   a capacitor between the second node and the third node.

14. The semiconductor storage according to claim 13, wherein
   the sense amplifier further includes a seventh transistor that controls a connection of the sixth transistor to a latch circuit, and
   the sixth transistor is turned on in a seventh time period after the sixth time period.

15. The semiconductor storage according to claim 14, wherein
   during the first and second time periods, the potential of the third node is fixed at a first voltage.

16. The semiconductor storage according to claim 15, wherein
during the second time period and before the third time period, the fourth and fifth transistors are turned on while the third transistor is off.

17. The semiconductor storage according to claim 16, wherein
the fourth transistor is turned on while the fifth transistor is turned off and the third node is in an electrically floating state.

18. A method of performing a read operation on a semiconductor storage having a plurality of memory cells formed above a semiconductor substrate, a plurality of bit lines electrically connected to the memory cells, a plurality of sense amplifiers electrically connected to the plurality of the bit lines, each of the sense amplifiers including a first transistor that controls precharging of the bit line, a second transistor that controls a charging of a first node, a third transistor that controls a connection of the bit line to the first node, a fourth transistor that controls a connection of the first node to a second node, a fifth transistor that controls a connection of the first node to a third node, and a sixth transistor that is controlled by a potential of the third node, and a controller configured to control the first through sixth transistors to perform a read operation based on the potential of the third node, said method comprising:
turning on the first through fourth transistors during a first time period;
turning off the second transistor in a second time period after the first time period;
turning on the second transistor and turning off the fourth transistor in a third time period after the second time period;
turning off the second transistor in a fourth time period after the third time period;
turning off the third and fourth transistors and turning on the fifth transistor in the fifth time period after the fourth time period; and
turning on the fourth transistor in a sixth time period after the fifth time period, wherein a first voltage is kept during the read operation, the first voltage being applied to a gate of a selected memory cell.

19. The method according to claim 18, further comprising:
during the second time period and before the third time period, turning on the fourth and fifth transistors while the third transistor is off.

* * * * *